(12) United States Patent
Iwahori

(10) Patent No.: US 11,342,412 B2
(45) Date of Patent: May 24, 2022

(54) SEMICONDUCTOR INTEGRATED CIRCUIT DEVICE

(71) Applicant: SOCIONEXT INC., Kanagawa (JP)

(72) Inventor: Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 92 days.

(21) Appl. No.: 16/897,809

(22) Filed: Jun. 10, 2020

(65) Prior Publication Data

US 2020/0303501 A1 Sep. 24, 2020

Related U.S. Application Data

(63) Continuation of application No. PCT/JP2018/043560, filed on Nov. 27, 2018.

(30) Foreign Application Priority Data

Dec. 12, 2017 (JP) .............................. JP2017-237773

(51) Int. Cl.
| | |
|---|---|
| *H01L 29/06* | (2006.01) |
| *H01L 23/528* | (2006.01) |
| *H01L 27/092* | (2006.01) |
| *H01L 29/78* | (2006.01) |

(52) U.S. Cl.
CPC ...... *H01L 29/0676* (2013.01); *H01L 23/5286* (2013.01); *H01L 27/092* (2013.01); *H01L 29/7827* (2013.01)

(58) Field of Classification Search
CPC ............. H01L 29/0676; H01L 23/5286; H01L 27/092; H01L 29/7827

USPC .......................................................... 257/329
See application file for complete search history.

(56) References Cited

U.S. PATENT DOCUMENTS

| | | | |
|---|---|---|---|
| 10,541,240 B2 * | 1/2020 | Okagaki | ............. H01L 23/5226 |
| 11,094,695 B2 * | 8/2021 | Liaw | ................... H01L 27/0886 |
| 2008/0105929 A1 | 5/2008 | Eimitsu et al. | |
| 2010/0244142 A1 | 9/2010 | Katakura | |

(Continued)

FOREIGN PATENT DOCUMENTS

| | | |
|---|---|---|
| JP | 2008-118004 A | 5/2008 |
| JP | 2011-228519 A | 11/2011 |

(Continued)

OTHER PUBLICATIONS

International Search Report issued in International Patent Application No. PCT/JP2018/043560, dated Feb. 19, 2019; with English translation.

(Continued)

*Primary Examiner* — Mohammad M Hoque
(74) *Attorney, Agent, or Firm* — McDermott Will & Emery LLP

(57) ABSTRACT

A layout structure of a standard cell using vertical nanowire (VNW) FETs is provided. A p-type transistor region in which VNW FETs are formed and an n-type transistor region in which VNW FETs are formed are provided between a power supply interconnect VDD and a power supply interconnect VSS. A local interconnect is placed across the p-type transistor region and the n-type transistor region. The top electrode of a transistor that is a dummy VNW FET is connected with the local interconnect.

5 Claims, 23 Drawing Sheets

(56) References Cited

U.S. PATENT DOCUMENTS

| | | | |
|---|---|---|---|
| 2011/0133165 A1* | 6/2011 | Bangsaruntip | ........ H01L 29/775 438/151 |
| 2011/0260259 A1 | 10/2011 | Masuoka et al. | |
| 2016/0012169 A1 | 1/2016 | Chiang et al. | |
| 2016/0063163 A1 | 3/2016 | Moroz et al. | |
| 2016/0172360 A1 | 6/2016 | Shimbo | |
| 2017/0243888 A1 | 8/2017 | Shimbo | |

FOREIGN PATENT DOCUMENTS

| | | |
|---|---|---|
| WO | 2009/078069 A1 | 6/2009 |
| WO | 2015/025441 A1 | 2/2015 |
| WO | 2016/075859 A1 | 5/2016 |

OTHER PUBLICATIONS

Written Opinion of the International Searching Authority issued in International Patent Application No. PCT/JP2018/043560, dated Feb. 19, 2019; with partial English translation.

\* cited by examiner

Bottom~VNW FET

LI~M1

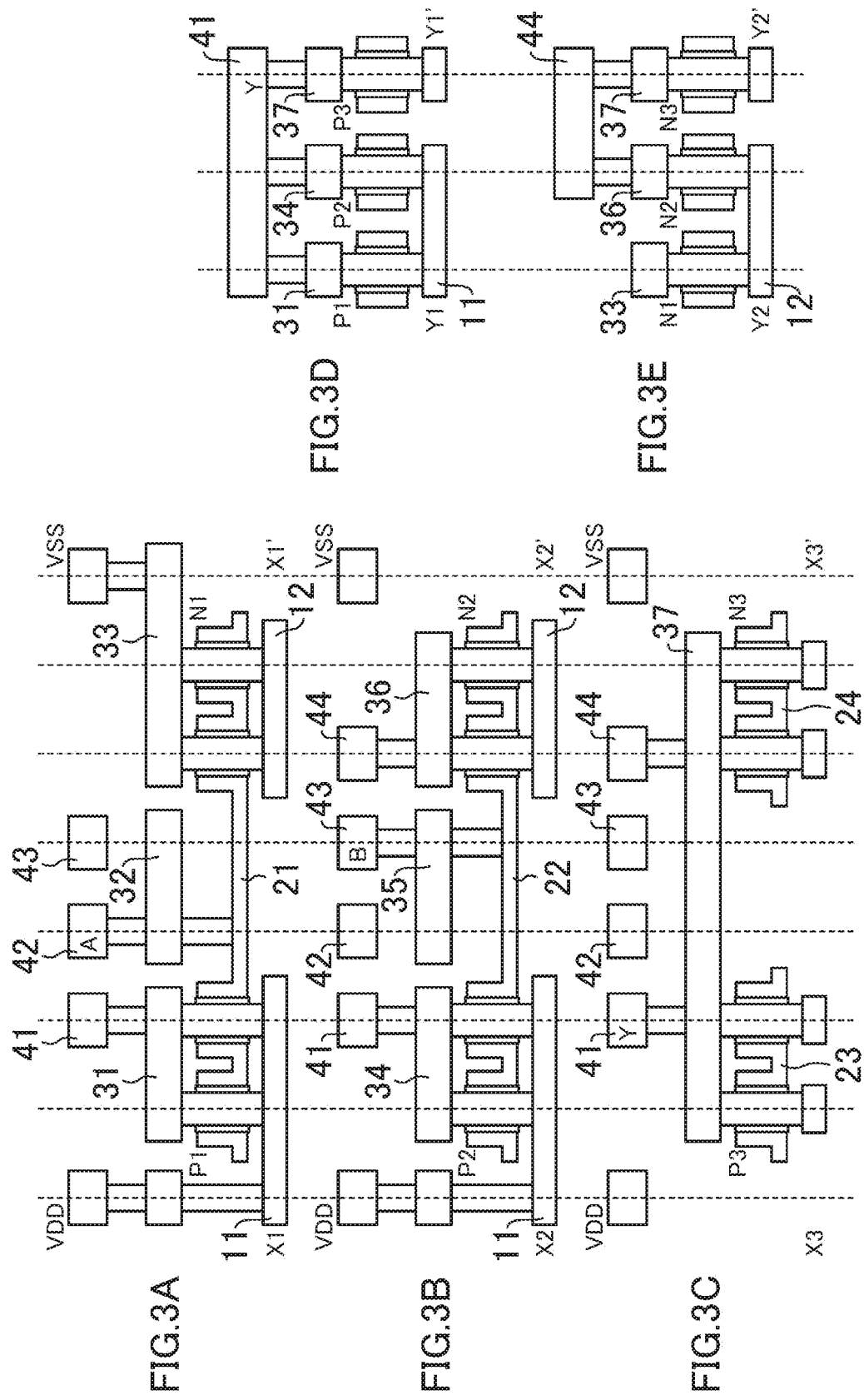

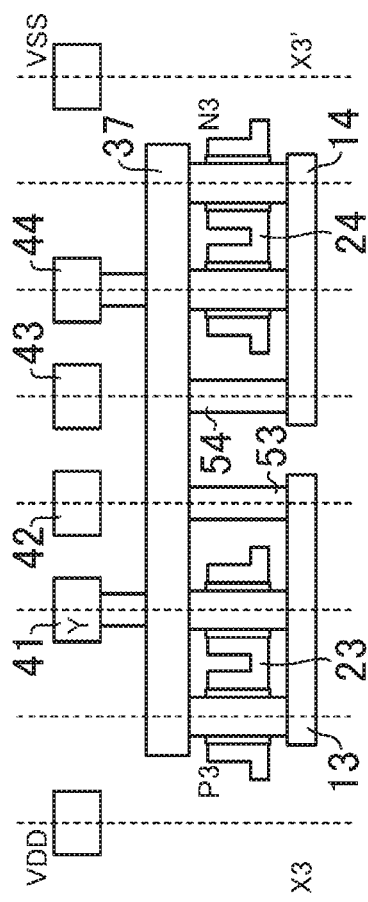
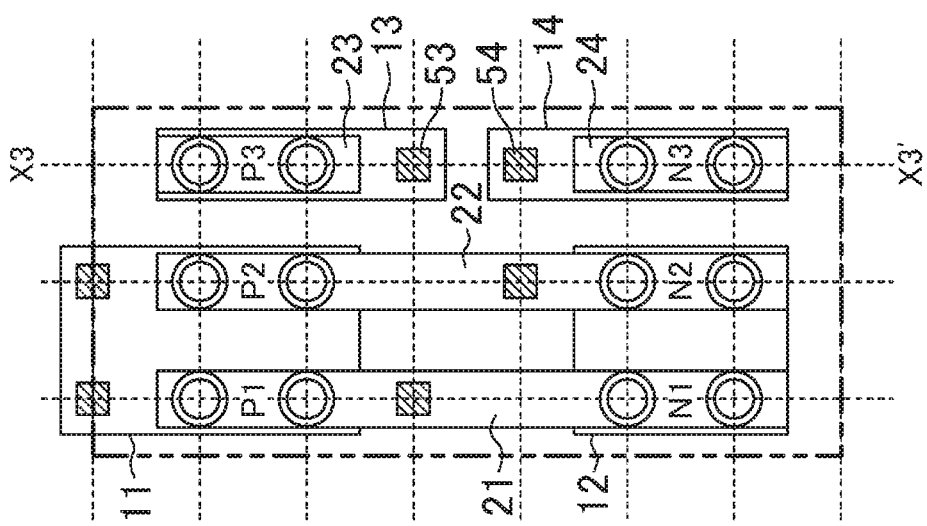

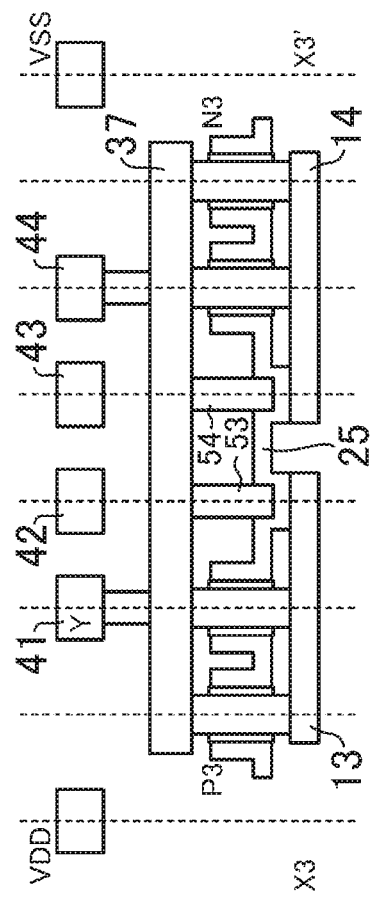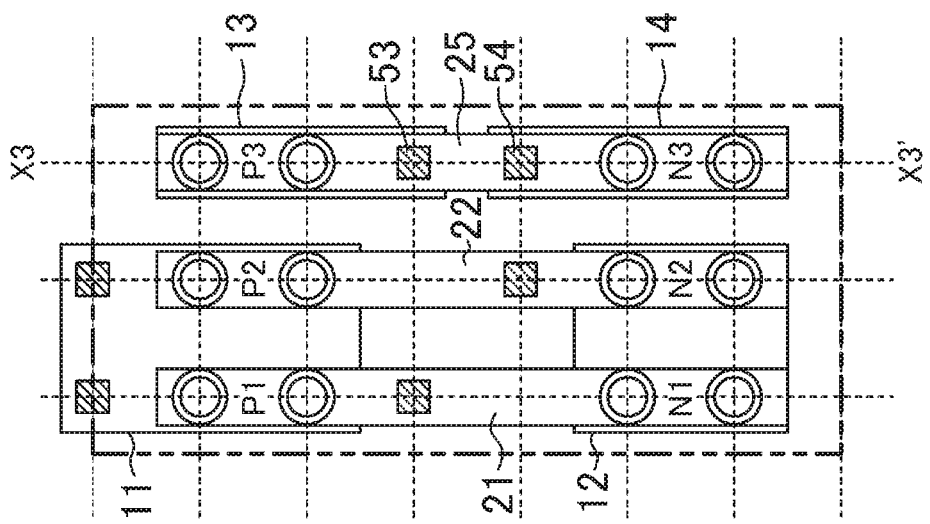

Bottom~VNW FET

LI~M1

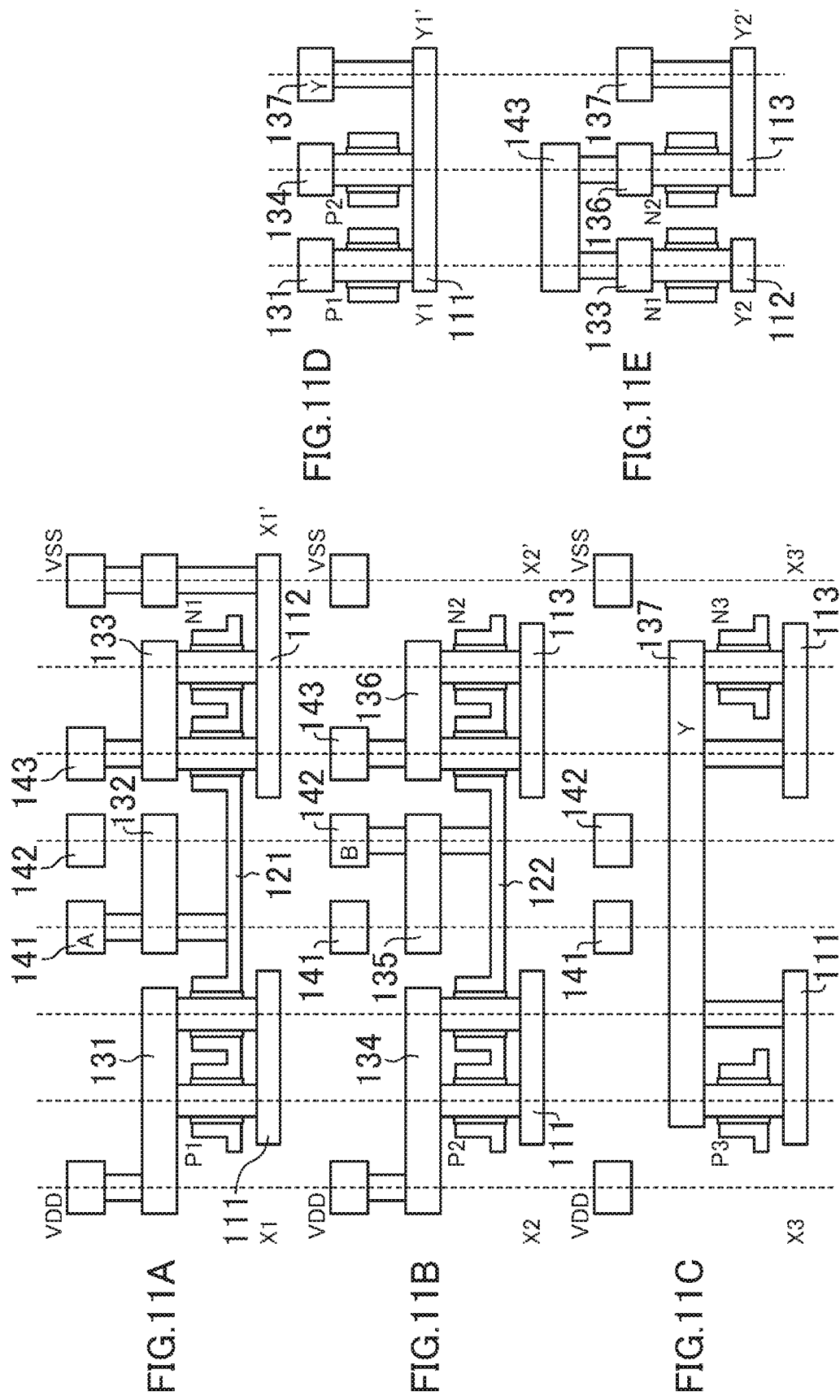

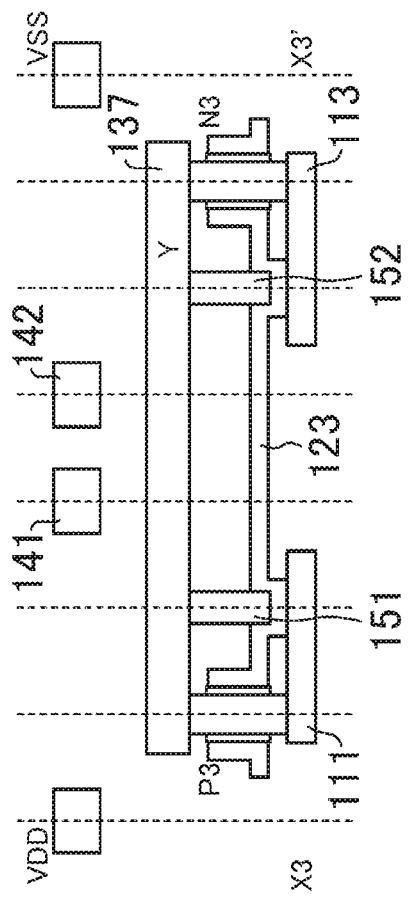
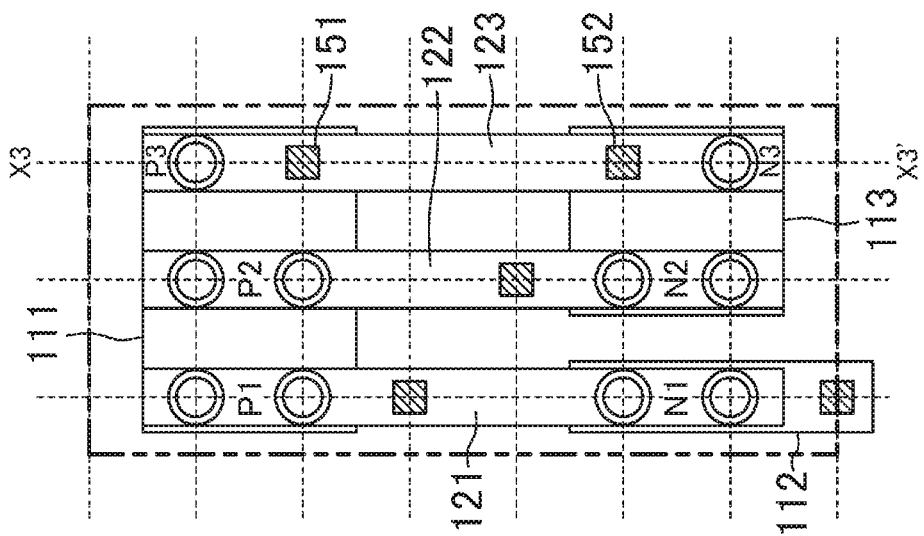

SEMICONDUCTOR INTEGRATED CIRCUIT DEVICE

CROSS-REFERENCE TO RELATED APPLICATIONS

This is a continuation of International Application No. PCT/JP2018/043560 filed on Nov. 27, 2018, which claims priority to Japanese Patent Application No. 2017-237773 filed on Dec. 12, 2017. The entire disclosures of these applications are incorporated by reference herein.

BACKGROUND

The present disclosure relates to a semiconductor integrated circuit device provided with standard cells each including vertical nanowire (VNW) field effect transistors (FETs).

A standard cell method is known as a method of forming a semiconductor integrated circuit on a semiconductor substrate. The standard cell method is a method in which basic units (e.g., inverters, latches, flipflops, and full adders) having specific logical functions are prepared in advance as standard cells, a plurality of standard cells are placed on a semiconductor substrate, and such standard cells are connected with interconnects, thereby designing an LSI chip.

Regarding transistors as basic constituents of an LSI, improvement in integration degree, reduction in operating voltage, and improvement in operating speed have been achieved thanks to the scaling of the gate length. Recently, however, an increase in off current due to excessive scaling and the resulting significant increase in power consumption have raised a problem. To solve this problem, three-dimensional transistors having a three-dimensional structure changed from the conventional planar structure have been vigorously studied. As one type of such transistors, a vertical nanowire PET (hereinafter referred to as a VNW FET as appropriate) has attracted attention.

U.S. Unexamined Patent Application Publication No. 2016/0063163 discloses a layout of a two-input NAND using VNW FETs. U.S. Unexamined Patent Application Publication No. 2016/0012169 discloses a layout of an inverter using VNW FETs.

SUMMARY

In a fabrication process of a semiconductor microstructure, preventing or reducing fabrication variations is a major problem to be tackled, and this is also true for a semiconductor integrated circuit device using VNW FETs. Reducing the area of a semiconductor integrated circuit device is also a major problem.

An objective of the present disclosure providing a layout structure of a semiconductor integrated circuit device provided with standard cells using VNW FETs, which prevents or reduces fabrication variations and achieves area reduction.

In the first mode of the present disclosure, a semiconductor integrated circuit device includes a standard cell, wherein the standard cell includes a first power supply interconnect extending in a first direction, configured to supply a first power supply voltage, a second power supply interconnect extending in the first direction, configured to supply a second power supply voltage different from the first power supply voltage, a p-type transistor region provided between the first power supply interconnect and the second power supply interconnect on a side closer to the first power supply interconnect, in which one or more active p-type vertical nanowire (VNW) FETs are formed, an n-type transistor region provided between the first power supply interconnect and the second power supply interconnect on a side closer to the second power supply interconnect, in which one or more active n-type VNW FETs are formed, and a signal interconnect placed across the p-type transistor region and the n-type transistor region, at least one dummy VNW FET is formed in at least either the p-type transistor region or the n-type transistor region, and a top electrode of the dummy VNW FET is connected with the signal interconnect.

According to the above mode, since the dummy VNW FET is placed, the distribution of VNW FETs is uniform, increasing the fabrication precision and preventing or reducing variations in transistor characteristics.

In the second mode of the present disclosure, a semiconductor integrated circuit device includes: a circuit block having a plurality of cell rows each including a plurality of standard cells arranged in a first direction, the cell rows being arranged in a second direction perpendicular to the first direction, wherein the circuit block includes a first power supply interconnect extending in the first direction, and first and second cell rows, which are part of the plurality of cell rows, placed on both sides of the first power supply interconnect in the second direction, the first and second cell rows sharing the first power supply interconnect, the first cell row includes a first standard cell having a first vertical nanowire (VNW) FET, the second cell row includes a second standard cell having a second VNW FET, the first VNW FET and the second VNW FET are placed at the same position in the first direction, and the first power supply interconnect is connected with at least either a top electrode or bottom electrode of the first VNW FET and connected with at least either a top electrode or bottom electrode of the second VNW FET.

According to the above mode, since the cell rows placed on both sides of the power supply interconnect in the second direction can share the power supply interconnect, reduction in the area of the semiconductor integrated circuit can be achieved.

According to the present disclosure, in a semiconductor integrated circuit device provided with standard cells using VNW FETs, it is possible to prevent or reduce fabrication variations and achieve area reduction.

BRIEF DESCRIPTION OF THE DRAWINGS

FIGS. 3A to 3E are cross-sectional views showing the layout structure of the standard cell according to the first embodiment.

FIGS. 6A and 6B are views showing an example of the layout structure of the standard cell according to Alteration 1 of the first embodiment, where FIG. 6A is a plan view and FIG. 6B is a cross-sectional view.

FIGS. 8A and 8B are views showing an example of the layout structure of the standard cell according to Alteration 2 of the first embodiment, where FIG. 8A is a plan view and FIG. 8B is a cross-sectional view.

FIGS. 11A to 11E are cross-sectional views showing the layout structure of the standard according to the second embodiment.

FIGS. 12A and 12B are views showing an example of the layout structure of a standard cell according to Alteration 1 of the second embodiment, where FIG. 12A is a plan view and FIG. 12B is a cross-sectional view.

FIG. 22A is a cross-sectional view and FIG. 22B is a plan view.

FIG. 24A is a plan view and FIGS. 24B and 24C are cross-sectional views.

DETAILED DESCRIPTION

Embodiments of the present disclosure will be described hereinafter with reference to the accompanying drawings. In the following embodiments, it is assumed that a semiconductor integrated circuit device includes a plurality of standard cells, and that at least some of the plurality of standard cells include so-called vertical nanowire FETs (VNW FETs).

Figure 22A:
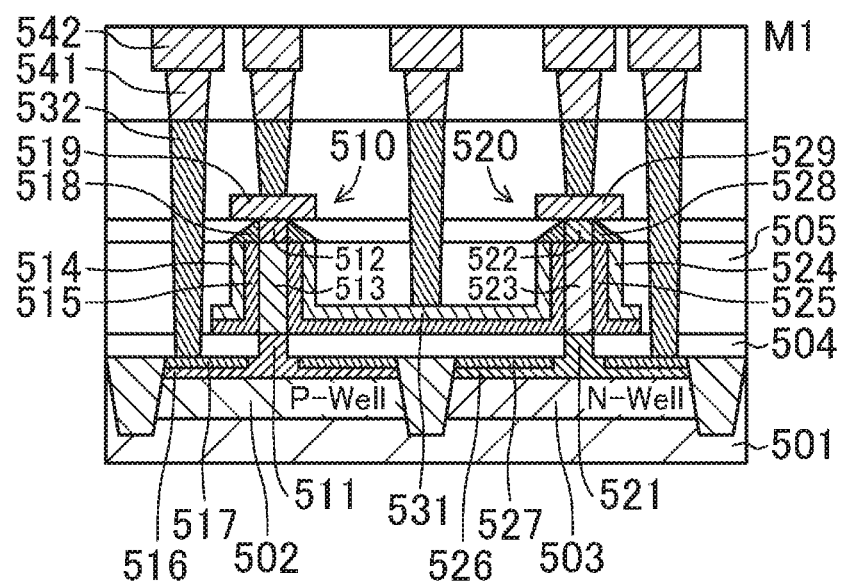
FIGS. 22A and 22B are schematic views showing a basic structure example of vertical nanowire FETs, where
Figure 22B:
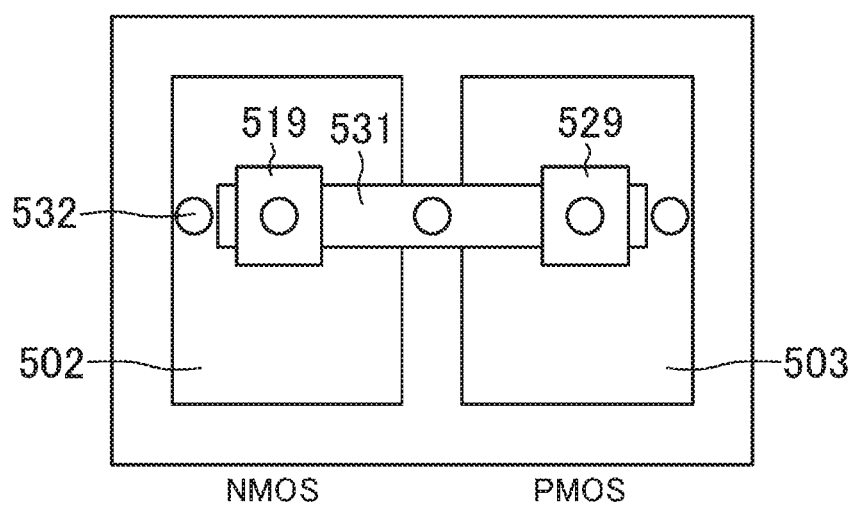

FIGS. 22A and 22B are schematic views showing a basic structure example of VNW FETs, where FIG. 22A is a cross-sectional view and FIG. 22B is a plan view. Note that, in FIG. 22B, illustration of metal interconnects is omitted and, for easy understanding, constituents invisible when actually viewed from top are illustrated.

As shown in FIGS. 22A and 22B, a p-well 502 and an n-well 503 are formed on a semiconductor substrate 501. Note however that no p-well may be formed when the semiconductor substrate 501 is a p-type substrate. A FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515. The gate electrode 514 may surround the entire of the nanowire 513, or may surround only part of the nanowire 513. When the gate electrode 514 surrounds only part of the nanowire 513, the gate insulating film 515 may be formed on only the portion of the nanowire 513 surrounded by the gate electrode 514.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note that the sidewall 518 and the silicide region 519 may not be formed.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note that the sidewall 528 and the silicide region 529 may not be formed.

In the structure of FIGS. 22A and 22B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, BF2, In, N, C, and combinations thereof.

The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi.

Examples of the material of the gate electrodes 514 and 524 and the gate interconnect 531 include TiN, TaN, TiAl, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O_5$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 23A:
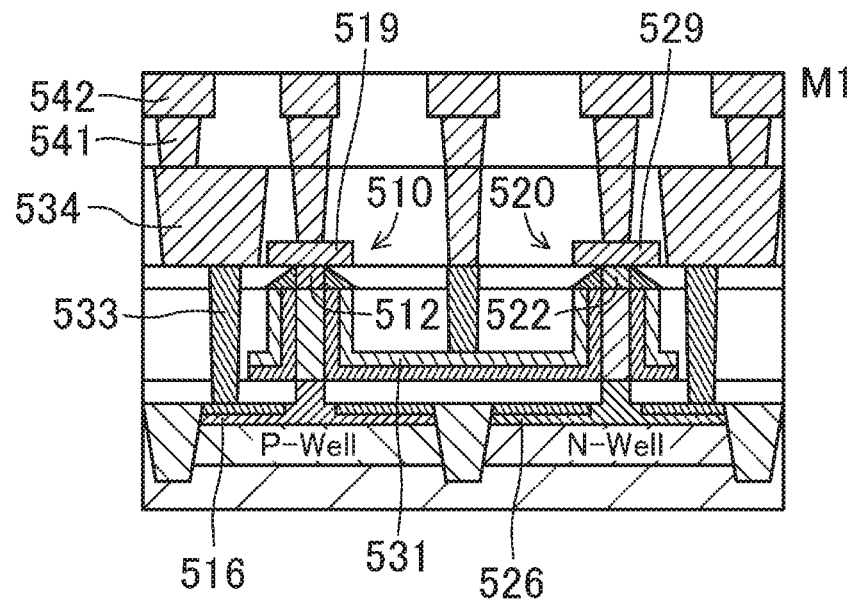
FIGS. 23A and 23B are schematic plan views showing basic structure examples of vertical nanowire FETs in which local interconnects are used.
Figure 23B:
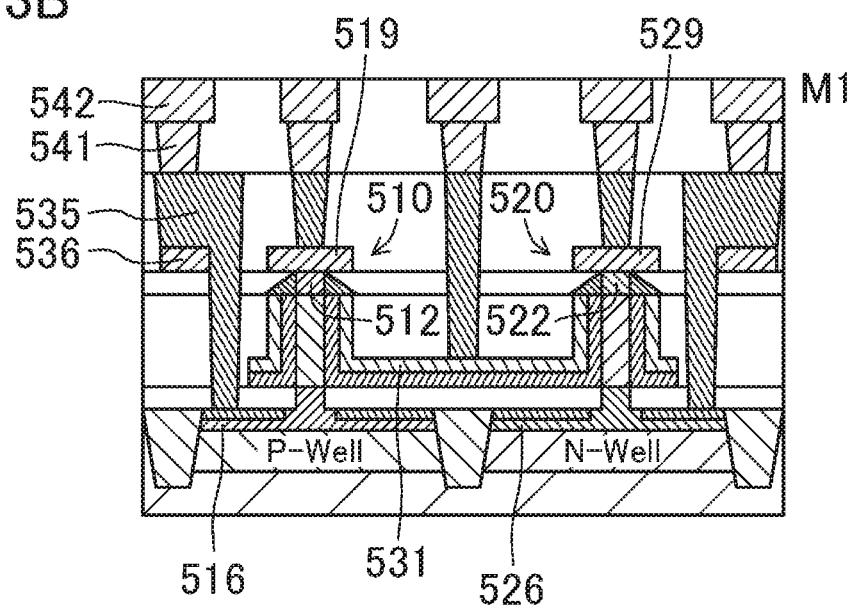

FIGS. 23A and 23B show basic structure examples of VNW FETs in which local interconnects are used. In FIG. 23A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, local interconnects 534, and the contacts 541. The silicide regions 519 and 529 are individually connected to the interconnects 542 formed in the metal interconnect layer M1 via the local interconnects 534 and the contacts 541.

In FIG. 23B, local interconnects 535 are formed between the metal interconnect layer M1 and the bottom regions 516 and 526. In other words, the local interconnect 535 corresponds to an integrated form of the contact 533 and the local interconnect 534 in FIG. 23A. Silicide regions 536 are used as an etching stopper in the process of forming the local interconnects 535.

Figure 24C:
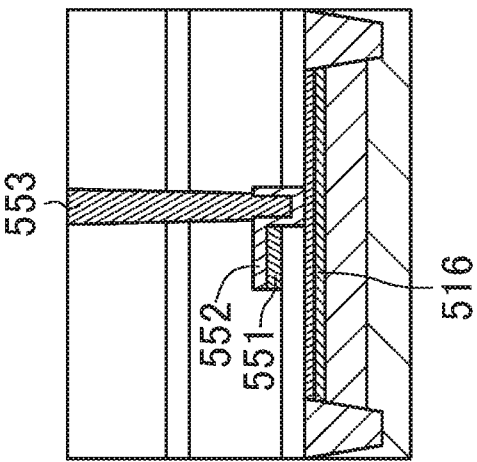
FIGS. 24A to 24C show a structure example of vertical nanowire FETs in which gate electrodes and a bottom region are connected, where
Figure 24A:
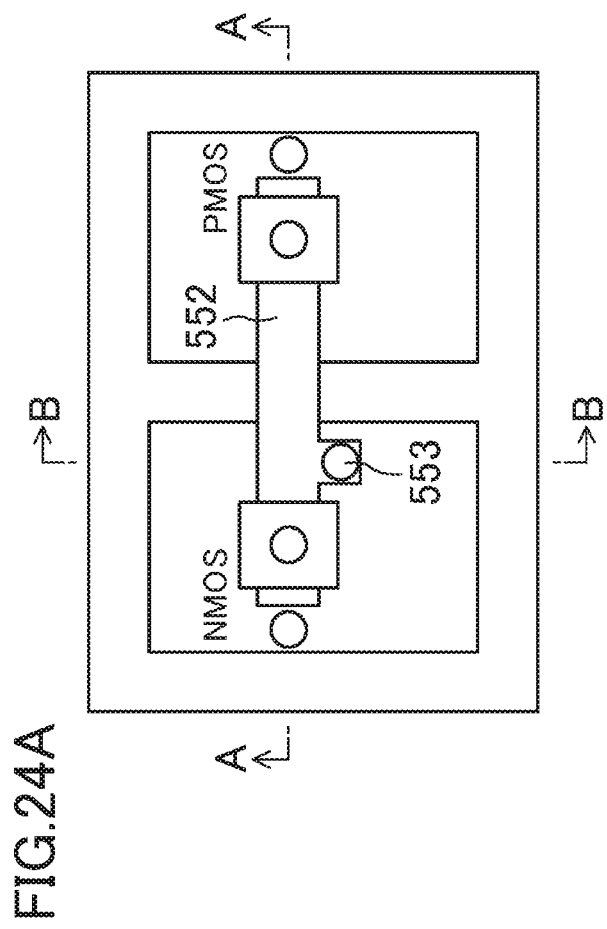
Figure 24B:
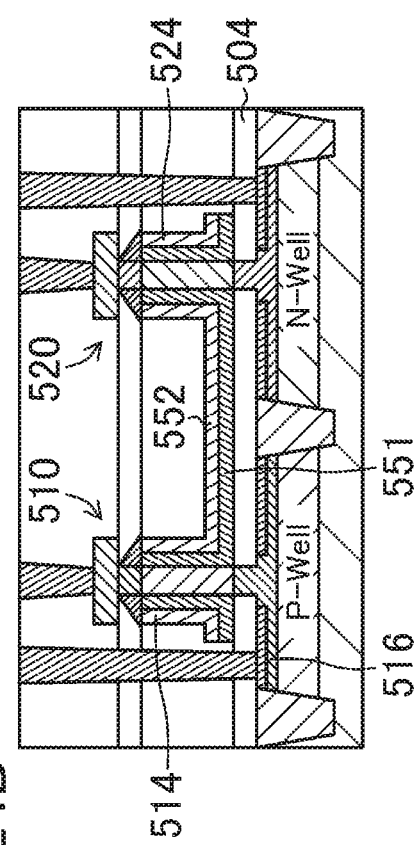

FIGS. 24A to 24C show a structure example of VNW FETs in which gate electrodes and a bottom region are connected, where FIG. 24A is a plan view, FIG. 24B is a cross-sectional view taken along line A-A in FIG. 24A, and FIG. 24C is a cross-sectional view taken along line B-B in FIG. 24A. As shown in FIGS. 24A to 24C, after formation of a gate insulating film 551, a hole extending through the gate insulating film 551 and the underlying insulating film 504 to reach the bottom region 516 is formed before formation of the gate electrodes 514 and 524. A gate electrode film 552 is formed on the gate insulating film 551 including the hole. In this way, the gate electrodes 514 and 524 and the bottom region 516 are connected. A contact 553 is formed in the hole.

As used herein, a VNW FET that contributes to the logical function of the standard cell is called an "active VNW FET," and a VNW FET that does not contribute to the logical function of the standard cell is called a "dummy VNW FET." In the following description, the bottom electrode, top electrode, and gate electrode of a VNW FET are simply referred to as the bottom, the top, and the gate, respectively, as appropriate. Also, when one or a plurality of configuration units each constituted by a vertical nanowire, a top, a bottom, and a gate constitute one VNW FET, this configuration unit is simply referred to as a "NNW" to distinguish this from the VNW FET. The standard cell is simply referred to as a cell as appropriate.

As used herein, an expression indicating that widths, etc. are the same, like the "same interconnect width" should be understood as including a range of fabrication variations.

First Embodiment

Figure 1:
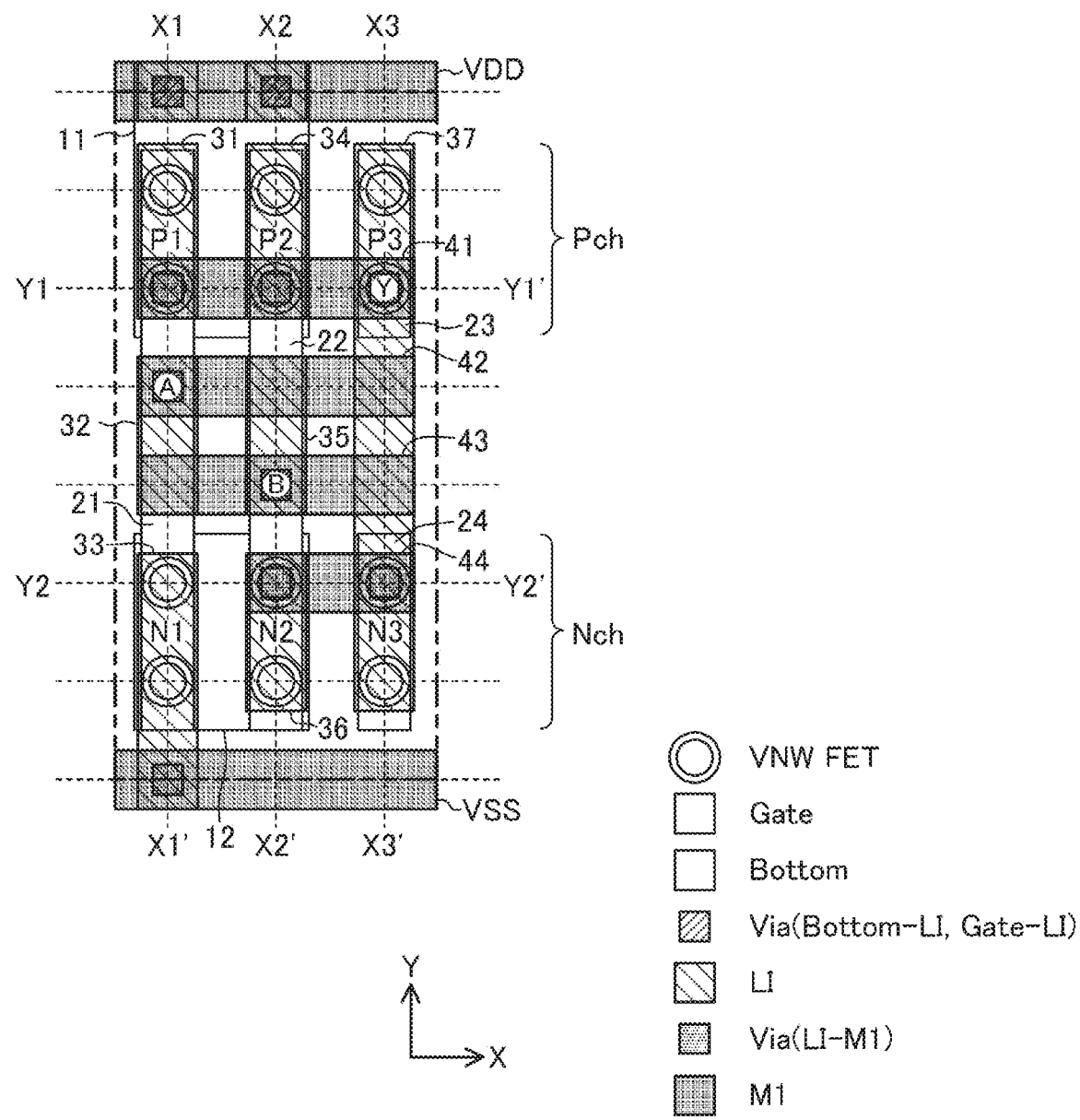
FIG. 1 is a plan view showing an example of the layout structure of a standard cell according to the first embodiment.
Figure 2A:
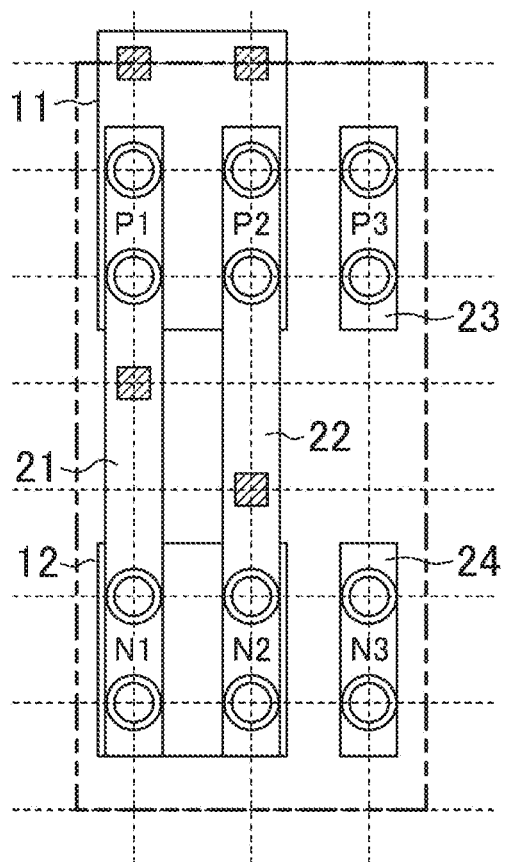
FIGS. 2A and 2B are plan views in different layers showing the layout structure of the standard cell according to the first embodiment.
Figure 2B:
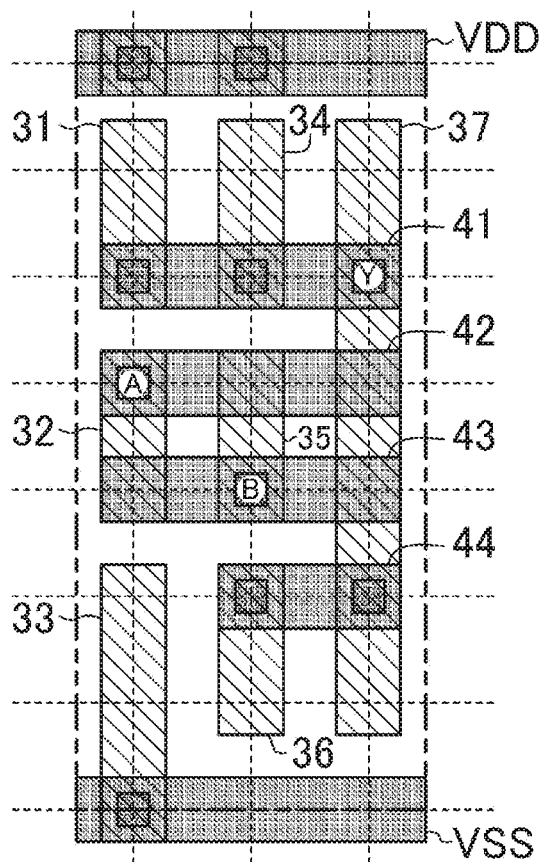

FIGS. 1, 2A-2B, and 3A-3E are views showing an example of the layout structure of a cell according to the first embodiment, where FIG. 1 is a plan view, FIGS. 2A and 2B are plan views in different layers, and FIGS. 3A to 3E are cross-sectional views. Specifically, FIG. 2A shows VNW FETs and layers below them, and FIG. 2B shows layers above the VNW FETs. FIGS. 3A to 3C are cross-sectional views in the vertical direction as viewed from top in FIG. 1 and FIGS. 3D and 3E are cross-sectional views in the horizontal direction as viewed from top in FIG. 1, where FIG. 3A shows a cross section taken along line X1-X1', FIG. 3B shows a cross section taken along line X2-X2', FIG. 3C shows a cross section taken along line X3-X3', FIG. 3D shows a cross section taken along line Y1-Y1', and FIG. 3E shows a cross section taken along line Y2-Y2'.

Figure 4:
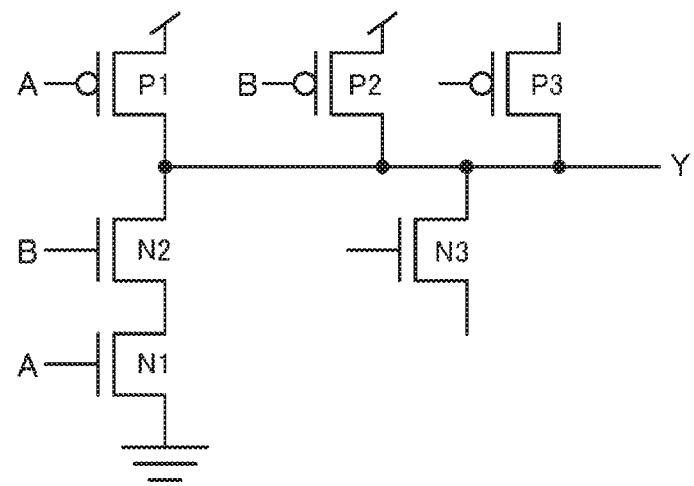
FIG. 4 is a circuit diagram of the standard cell according to the first embodiment.

FIG. 4 is a circuit diagram of the cell shown in FIGS. 1, 2A-2B, and 3A-3E. As shown in FIG. 4, the cell implements a two-input NAND circuit having inputs A and B and an output Y.

Note that, in the following description, in the plan views such as FIG. 1, the horizontal direction as viewed from the figure is referred to as the X direction (corresponding to the first direction) and the vertical direction is referred to as the Y direction (corresponding to the second direction). Also, the dashed lines running vertically and horizontally in the plan views such as FIG. 1 and the dashed lines running vertically in the cross-sectional views such as FIGS. 3A-3E represent grid lines used for placement of components at the time of designing. The grid lines are placed at equal spacing in the X direction and placed at equal spacing in the Y direction. The grid spacing may be the same, or different from each other, in the X and Y directions. Also, the grid spacing may be different between layers. For example, grid lines for VNW FETs and grid lines for M1 interconnects may be arranged at different spacing from each other. Further, the components may not be necessarily placed on grid lines. It is however preferable to place the components on grid lines from the standpoint of preventing or reducing fabrication variations.

The device structure of this embodiment is based on the structure of FIG. 23A, although it can be a structure based on the structure of FIG. 22 or FIG. 23B, or based on any other device structure. This also applies to the subsequent embodiments. Also, for easy understanding of the figures, illustration of the wells, the STIs, the insulating films, the suicide layers on the bottoms, the silicide layers on the tops, and the sidewalls of the tops is omitted. This also applies to the subsequent drawings.

As shown in FIGS. 1, 2A-2B, and 3A-3E, power supply interconnects VDD and VSS extending in the X direction are respectively provided on the top and bottom (both ends in the Y direction) of the cell. Note that VDD and VSS are used as symbols indicating both the power supply interconnects and the power supply voltages supplied through the power supply interconnects. The power supply interconnects VDD and VSS are formed in an M1 interconnect layer. The power supply interconnects VDD and VSS can be shared by cells upwardly or downwardly adjacent to the interconnects. It is however acceptable to adopt a layout in which the power supply interconnects are not shared by cells upwardly or downwardly adjacent to the interconnects.

Interconnects 41, 42, 43, and 44 extending in the X direction are formed in parallel in the M1 interconnect layer. The interconnect 41 corresponds to the output Y, the interconnect 42 corresponds to the input A, and the interconnect 43 corresponds to the input B.

A p-type transistor region (shown as Pch, which also applies to the subsequent plan views) and an n-type transistor region (shown as Nch, which also applies to the subsequent plan views) are formed between the power supply interconnects VDD and VSS. The p-type transistor region is provided on the side closer to the power supply interconnect VDD and the n-type transistor region is provided on the side closer to the power supply interconnect VSS. In the p-type transistor region, transistors P1, P2, and P3 are arranged in the X direction. Each of the transistors P1, P2, and P3 has two VNWs lying side by side in the Y direction. In the n-type transistor region, transistors N1, N2, and N3 are arranged in the X direction. Each of the transistors N1 N2, and N3 has two VNWs lying side by side in the Y direction. The transistors P1, P2, N1, and N2 are active VNW FETs, and the transistors P3 and N3 are, dummy VNW FETs.

The bottoms of the transistors P1 and P2 are connected to a bottom region 11. The bottom region 11 spreads over to a range overlapping the power supply interconnect VDD as viewed from top. The bottom region 11 is connected with the power supply interconnect VDD through local interconnects and vias, to receive the power supply voltage VDD. The top of the transistor P1 is connected to a local interconnect 31, and the top of the transistor P2 is connected to a local interconnect 34. The local interconnects 31 and 34 extend in parallel in the Y direction, and are connected with the interconnect 41 that is to be the output Y through vias.

The gate of the transistor P1 is connected with a gate interconnect 21, and the gate of the transistor P2 is connected with a gate interconnect 22. The gate interconnects 21 and 22 extend in parallel in the Y direction across the p-type transistor region and the n-type transistor region. The gate interconnect 21 is connected with a local interconnect 32 through a via. The gate interconnect 22 is connected with a local interconnect 35 through a via. The local interconnects 32 and 35 extend in parallel in the Y direction. The local interconnect 32 is connected with the interconnect 42 that is to be the input A through a via. The local interconnect 35 is connected with the interconnect 43 that is to be the input B through a via.

The transistor P3 is floating at its bottom that is not connected to the bottom region 11, and is connected to a local interconnect 37 at its top. The local interconnect 37 extends in the Y direction across the p-type transistor region and the n-type transistor region. The local interconnect 37 is an example of the signal interconnect according to the present disclosure. The local interconnect 37 is connected with the interconnect 41 that is to be the output Y through a via. That is, the top of the transistor P3 is connected with the interconnect 41 that is to be the output Y through the local interconnect 37 and a via. The local interconnect 37 is also connected with an interconnect 44 through a via. The gates of the two VNWs constituting the transistor P3 are connected through a gate interconnect 23. The transistor P3 corresponds to the first dummy VNW FET.

The bottoms of the transistors N1 and N2 are connected to a bottom region 12. The top of the transistor N1 is connected to a local interconnect 33, and the top of the transistor N2 is connected to a local interconnect 36. The local interconnects 33 and 36 extend in parallel in the Y direction. The local interconnect 33 extends to a region overlapping the power supply interconnect VSS as viewed from top, and is connected with the power supply interconnect VSS through a via. The local interconnect 36 is connected to the interconnect 44 through a via, and connected to the interconnect 41 that is to be the output Y through the interconnect 44 and the local interconnect 37.

The gate of the transistor N1 is connected with the gate interconnect 21 that is connected with the gate of the transistor P1, and the gate of the transistor N2 is connected with the gate interconnect 22 that is connected with the gate of the transistor P2. As described above, the gate interconnect 21 is connected with the interconnect 42 that is to be the input A through a via, the local interconnect 32, and a via. Also, the gate interconnect 22 is connected with the interconnect 43 that is to be the input B through a via, the local interconnect 35, and a via.

The transistor N3 is floating at its bottom that is not connected to the bottom region 12, and is connected to the local interconnect 37 at its top. That is, the top of the transistor N3 is connected with the interconnect 41 that is to be the output Y through the local interconnect 37 and a via. The gates of the two VNWs constituting the transistor N3 are connected through a gate interconnect 24. The transistor N3 corresponds to the second dummy VNW FET.

Having the layout structure as described above, functions and effects as follows are obtained.

In the p-type transistor region, the transistor P3 that is a dummy VNW FET is placed. This makes the distribution of p-type VNW FETs uniform, increasing the fabrication precision and also preventing or reducing variations in transistor characteristics. Likewise, in the n-type transistor region, the transistor N3 that is a dummy VNW FET is placed. This makes the distribution of n-type VNW FETs uniform, increasing the fabrication precision and also preventing or reducing variations in transistor characteristics.

The gates of the two VNWs constituting the transistor P3 are mutually connected through the gate interconnect 23, and the gates of the two VNWs constituting the transistor N3 are mutually connected through the gate interconnect 24. This prevents or reduces variations in gate pattern, increasing the fabrication precision and also preventing or reducing variations in transistor characteristics.

The gate interconnects 21, 22, 23, and 24 all extend in the Y direction and have the same interconnect width. This makes fabrication easy and increases the fabrication precision. The local interconnects 31, 32, 33, 34, 35, 36, and 37 all extend in the Y direction and have the same interconnect width. This makes fabrication easy and increases the fabrication precision. The interconnects 41, 42, 43, and 44 in the M1 interconnect layer all extend in the X direction and have the same interconnect width. This makes fabrication easy and increases the fabrication precision.

The local interconnect 37 is connected to the two VNWs constituting the transistor P3 and the two VNWs constituting the transistor N3. Alternatively, the local interconnect 37 may be connected to only one VNW of the transistor P3 closer to the center of the cell and one VNW of the transistor N3 closer to the center of the cell. This will reduce the load capacitance of the interconnect 41 that is to be the output Y.

Also, since the local interconnect 37 can be shortened, the load capacitance can be further reduced.

The transistor P3 may be constituted by one VNW and the transistor N3 may be constituted by one VNW. In this case, by placing the VNW of the transistor P3 and the VNW of the transistor N3 at positions closer to the center of the cell, the local interconnect 37 can be shortened.

Either one or both of the transistor P3 and the transistor N3 may be omitted. This can further reduce the load capacitance.

A bottom region for connecting the bottoms of the two VNWs constituting the transistor P3 may be formed. Also, a bottom region for connecting the bottoms of the two VNWs constituting the transistor N3 may be formed. This will make pattern formation of the bottom regions easy.

A gate interconnect for connecting the gates of the two VNWs constituting the transistor P3 and the gates of the two VNWs constituting the transistor N3 may be formed. This will make the gate pattern uniform and improve the fabrication easiness.

(Alteration 1 of First Embodiment)

In the first embodiment, the transistors P3 and N3 that are dummy VNW FETs are floating at their bottoms. In contrast to this, in Alteration 1, the bottoms of the transistors P3 and N3 are connected to the output Y as shown by the dashed lines in the circuit diagram of FIG. 5. This avoids floating at the bottoms of the transistors P3 and N3, and thus the stability of the circuit operation improves.

FIGS. 6A and 6B are views showing an example of the layout structure of a cell according to Alteration 1, where FIG. 6A is a plan view of VNW FETs and layers below them, and FIG. 6B is a cross-sectional view taken along line X3-X3' in FIG. 6A. In this alteration, bottom regions 13 and 14 are formed: the bottom of the transistor P3 is connected to the bottom region 13 and the bottom of the transistor N3 to the bottom region 14. The bottom region 13 connected to the local interconnect 37 through a via 53. Likewise, the bottom region 14 is connected to the local interconnect 37 through a via 54. Since the local interconnect 37 is connected to the interconnect 41 that is to be the output Y, the bottoms of the transistors P3 and N3 are connected to the output Y.

Thus, as described above, since floating at the bottoms of the transistors P3 and N3 is avoided, the stability of the circuit operation improves. In addition, since the uniformity of the pattern the bottom regions improves, fabrication becomes easier.

(Alteration 2 of First Embodiment)

Figure 7:
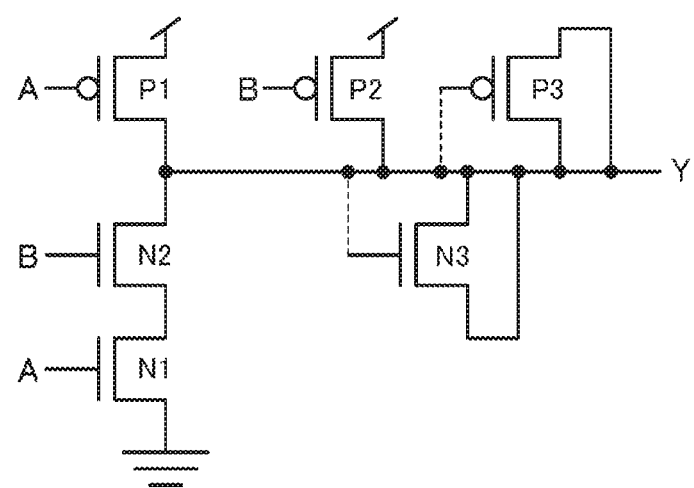
FIG. 7 is a circuit diagram of a standard cell according to Alteration 2 of the first embodiment.

In Alteration 1 above, while floating at the bottoms of the transistors P3 and N3 as dummy VNW FETs is avoided, floating at the gates thereof remains. In contrast to this, in Alteration 2, the gates of the transistors P3 and N3 are connected to the output Y as shown by the dashed lines in the circuit diagram of FIG. 7. This avoids floating at the gates of the transistors P3 and N3, and thus the stability of the circuit operation further improves.

FIGS. 8A and 8B are views showing an example of the layout structure of a cell according to Alteration 2, where FIG. 8A is a plan view of VNW FETs and layers below them, and FIG. 8B is a cross-sectional view taken along line X3-X3' in FIG. 8A. In this alteration, the gates of the transistors P3 and N3 are mutually connected through a gate interconnect 25. The gate interconnect 25 is connected to the vias 53 and 54, which are connected to the interconnect 41 that is to be the output Y through the local interconnect 37. Therefore, the gates of the transistors P3 and N3 are connected to the output Y.

Thus, as described above, since floating at the gates of the transistors P3 and N3 is avoided, the stability of the circuit operation improves. In addition, since the uniformity of the pattern of the gate interconnects improves, fabrication becomes easier. Moreover, since the gate interconnect 25 serves as a backing interconnect for the local interconnect 37, the resistance value of the signal interconnect can be reduced.

Second Embodiment

Figure 5:
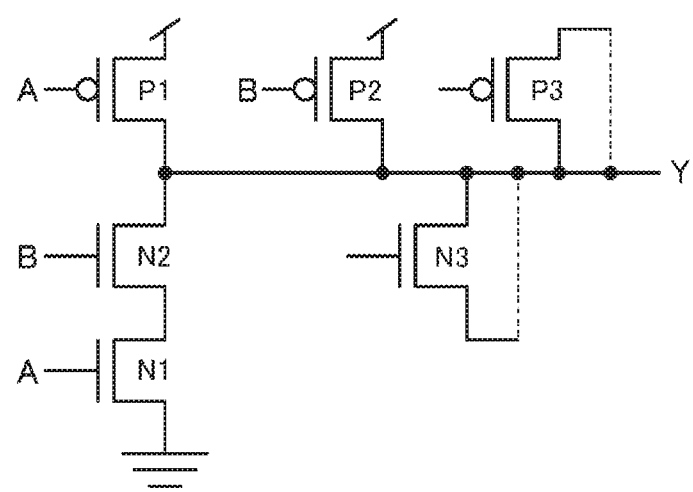
FIG. 5 is a circuit diagram of a standard cell according to Alteration 1 of the first embodiment.
Figure 9:
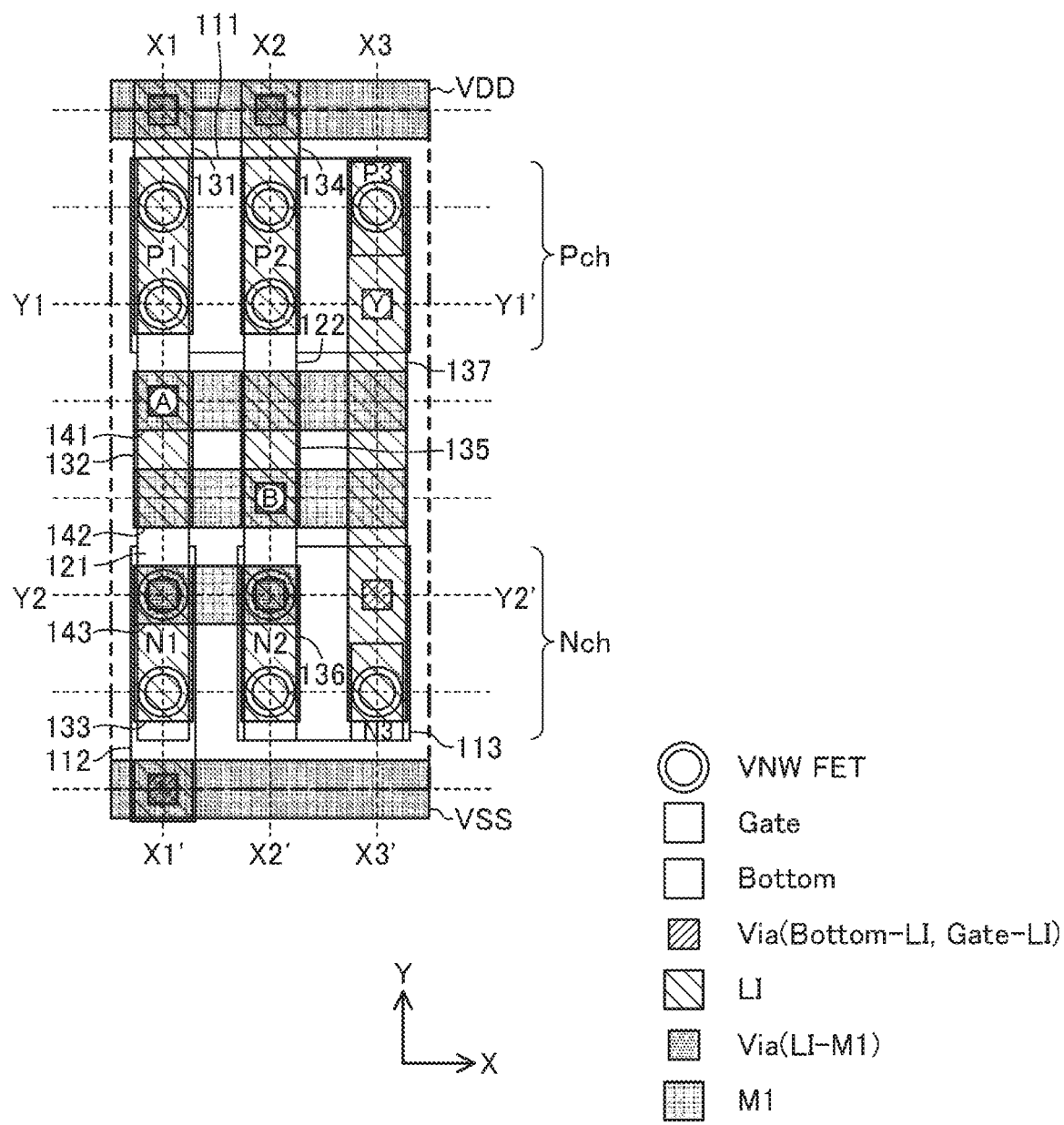
FIG. 9 is a plan view showing an example of the layout structure of a standard cell according to the second embodiment.
Figure 10A:
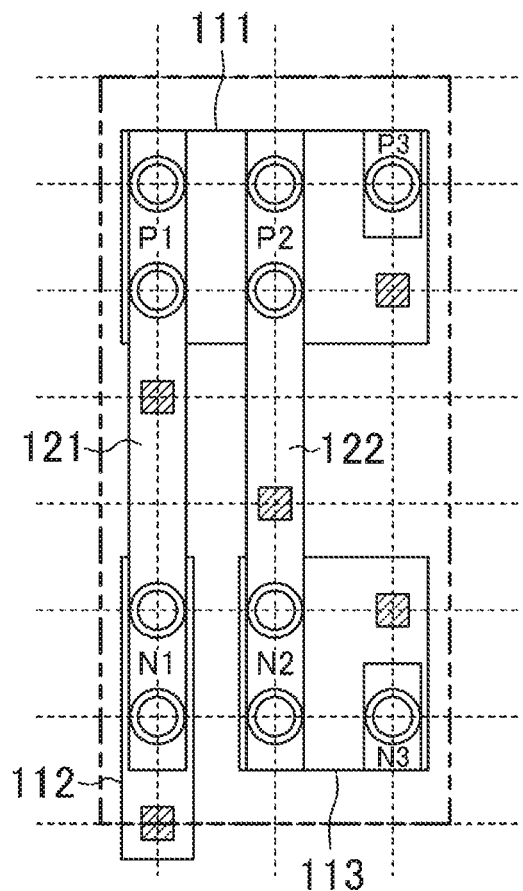
FIGS. 10A and 10B are plan views in different layers showing the layout structure of the standard cell according to the second embodiment.
Figure 10B:
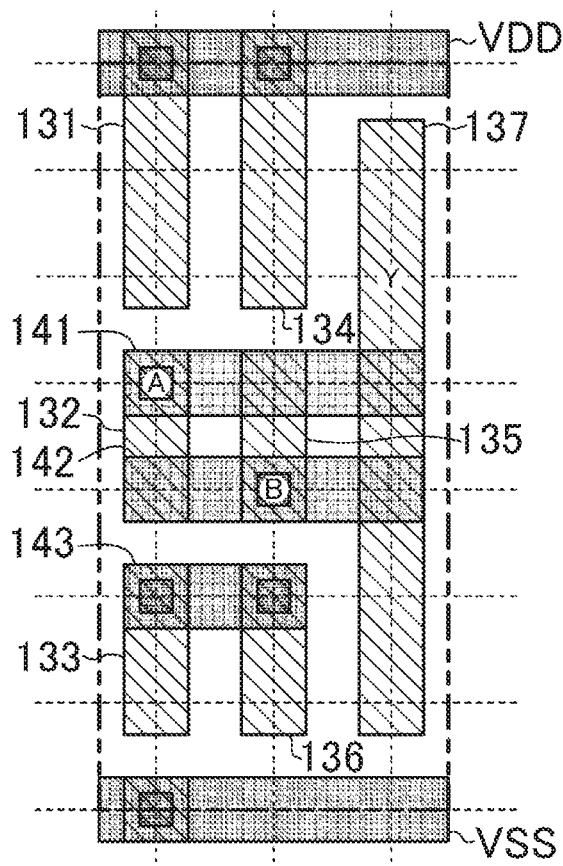

FIGS. 9, 10A-10B, and 11A-11E are views showing an example of the layout structure of a cell according to the second embodiment, where FIG. 9 is a plan view, FIGS. 10A and 10B are plan views in different layers, and FIGS. 11A to 11E are cross-sectional views. Specifically, FIG. 10A shows VNW FETs and layers below them, and FIG. 10B shows layers above the VNW FETs. FIGS. 11A to 11C are cross-sectional views in the vertical direction as viewed from top in FIG. 9 and FIGS. 11D and 11E are cross-sectional views in the horizontal direction as viewed from top in FIG. 9, where FIG. 11A shows a cross section taken along line X1-X1', FIG. 11B shows a cross section taken along line X2-X2', FIG. 11C shows a cross section taken along line X3-X3', FIG. 11D shows a cross section taken along line Y1-Y1', and FIG. 11E shows a cross section taken along line Y2-Y2'. The cell shown in FIGS. 9, 10A-10B, and 11A-11E implements a two-input NAND circuit having inputs A and B and an output Y as shown in FIG. 5.

To compare the cell according to this embodiment with the cell according to the first embodiment, the tops and bottoms of the transistors P1 to P3 and N1 to N3 are interchanged. Also, each of the transistors P3 and N3 that are dummy VNW FETs is constituted by one VNW and the top and bottom thereof are connected to the output Y. Note that, in the following description, description may be omitted for a configuration in common with the first embodiment.

Interconnects 141, 142, and 143 extending in the X direction are formed in parallel in an M1 interconnect layer. The interconnect 141 corresponds to the input A and the interconnect 142 corresponds to the input B. A local interconnect 137 corresponds to the output Y. Note that an interconnect connected with the local interconnect 137 may be formed in the M1 interconnect layer and used as the output Y.

The bottoms of the transistors P1 and P2 are connected bottom region 111. The bottom region 111 spreads over to the position of the transistor P3. The top of the transistor P1 is connected to a local interconnect 131, and the top of the transistor P2 is connected to a local interconnect 134. The local interconnects 131 and 134 extend in parallel in the Y direction to positions overlapping the power supply interconnect VDD as viewed from top, and are connected with the power supply interconnect VDD through vias.

The gate of the transistor P1 is connected with a gate interconnect 121, and the gate of the transistor P2 is connected with a gate interconnect 122. The gate interconnects 121 and 122 extend in parallel in the Y direct across the p-type transistor region and the n-type transistor region. The gate interconnect 121 is connected with a local interconnect 132 through a via. The gate interconnect 122 is connected with a local interconnect 135 through a via. The local interconnects 132 and 135 extend in parallel in the Y direction. The local interconnect 132 is connected with the interconnect 141 that is to be the input A through a via. The local interconnect 135 is connected with the interconnect 142 that is to be the input B through a via.

The transistor P3 is connected to the bottom region 111 at its bottom and connected to the local interconnect 137 that is to be the output Y at its top. The local interconnect 137 is an example of the signal interconnect according to the present disclosure. The bottom region 111 is connected with the local interconnect 137 that is the output Y through a via. The transistor P3 corresponds to the first dummy VNW FET.

The bottom of the transistor N1 is connected to a bottom region 112. The bottom region 112 spreads over to a range overlapping the power supply interconnect VSS as viewed from top. The bottom region 112 is connected with the power supply interconnect VSS through a via, a local interconnect, and a via, to receive the power supply voltage VSS. The bottom of the transistor N2 is connected to a bottom region 113. The bottom region 113 spreads over to the position of the transistor N3. The top of the transistor N1 is connected to a local interconnect 133, and the top of the transistor N2 is connected to a local interconnect 136. The local interconnects 133 and 136 extend in parallel in the Y direction and are both connected to an interconnect 143.

The gate of the transistor N1 is connected with the gate interconnect 121 that is connected with the gate of the transistor P1, and the gate of the transistor N2 is connected with the gate interconnect 122 that is connected with the gate of the transistor P2. As described above, the gate interconnect 121 is connected with the interconnect 141 that is to be the input A through a via, the local interconnect 132, and a via. Also, the gate interconnect 122 is connected with the interconnect 142 that is to be the input B through a via, the local interconnect 135, and a via.

The transistor N3 is connected to the bottom region 113 at its bottom and connected to the local interconnect 137 at its top. The transistor N3 corresponds to the second dummy VNW FET.

That is, in the layout structure of this embodiment, in the p-type transistor region, the power supply voltage VDD is supplied to the tops of the transistors P1 and P2, and the bottoms of the transistors P1 and P2 are connected in parallel to the bottom region 111. The bottom region 111 is then connected to the local interconnect 137 that is to be the output Y. In the n-type transistor region, the power supply voltage VSS is supplied to the bottom of the transistor N1, the tops of the transistors N1 and N2 are mutually connected through the interconnect 143, and the bottom of the transistor N2 is connected to the bottom region 113. The bottom region 113 is then connected to the local interconnect 137 that is to be the output Y.

Having the layout structure as described above, functions and effects as follows are obtained.

In the p-type transistor region, the transistor P3 that is a dummy VNW FET is placed. This prevents or reduces variations in the distribution of p-type VNW FETs, increasing the fabrication precision and also preventing or reducing variations in transistor characteristics. Like wise, in the n-type transistor region, the transistor N3 that is a dummy VNW FET is placed. This prevents or reduces variations in the distribution of n-type VNW FETs, increasing the fabrication precision and also preventing or reducing variations in transistor characteristics.

The gate interconnects 121 and 122 extend in Y direction and have the same interconnect width. This makes fabrication easy and increases the fabrication precision. The local interconnects 131, 132, 133, 134, 135, 136, and 137 all extend in the Y direction and have the same interconnect width. This makes fabrication easy and increases the fabrication precision. The interconnects 141, 142, and 143 in the M1 interconnect layer all extend in the X direction and have the same interconnect width. This makes fabrication easy and increases the fabrication precision.

The one VNW constituting the transistor P3 may be placed at a position closer to the center of the cell, and the one VNW constituting the transistor N3 may be placed at a position closer to the center of the cell, to ensure connection with the local interconnect 137.

Either one or both of the transistor P3 and the transistor N3 may be omitted. This can reduce the load capacitance of the local interconnect 137.

(Alteration 1 of Second Embodiment)

In the second embodiment, the transistors P3 and N3 as dummy VNW FETs are floating at their gates. In contrast to this, in Alteration 1, the gates of the transistors P3 and N3 are connected to the output Y as shown by the dashed lines in the circuit diagram of FIG. 7.

FIGS. 12A and 12B are views showing an example of the layout structure in Alteration 1, where FIG. 12A is a plan view of VNW FETs and layers below them, and FIG. 12B is a cross-sectional view taken along line X3-X3' in FIG. 12A. In this alteration, the gates of the transistors P3 and N3 are mutually connected through a gate interconnect 123. The gate interconnect 123 is connected to vias 151 and 152, which are connected to the interconnect 137 that is to be the output Y. Therefore, the gates of the transistors P3 and N3 are connected with the output Y.

Thus, as described above, since floating at the gates of the transistors P3 and N3 is avoided, the stability of the circuit operation improves. In addition, since the uniformity of the pattern of the gate interconnects improves, fabrication becomes easier. Moreover, since the gate interconnect 123 serves as a backing interconnect for the local interconnect 137, the resistance value can be reduced.

Other Embodiments (No. 1)

Figure 13:
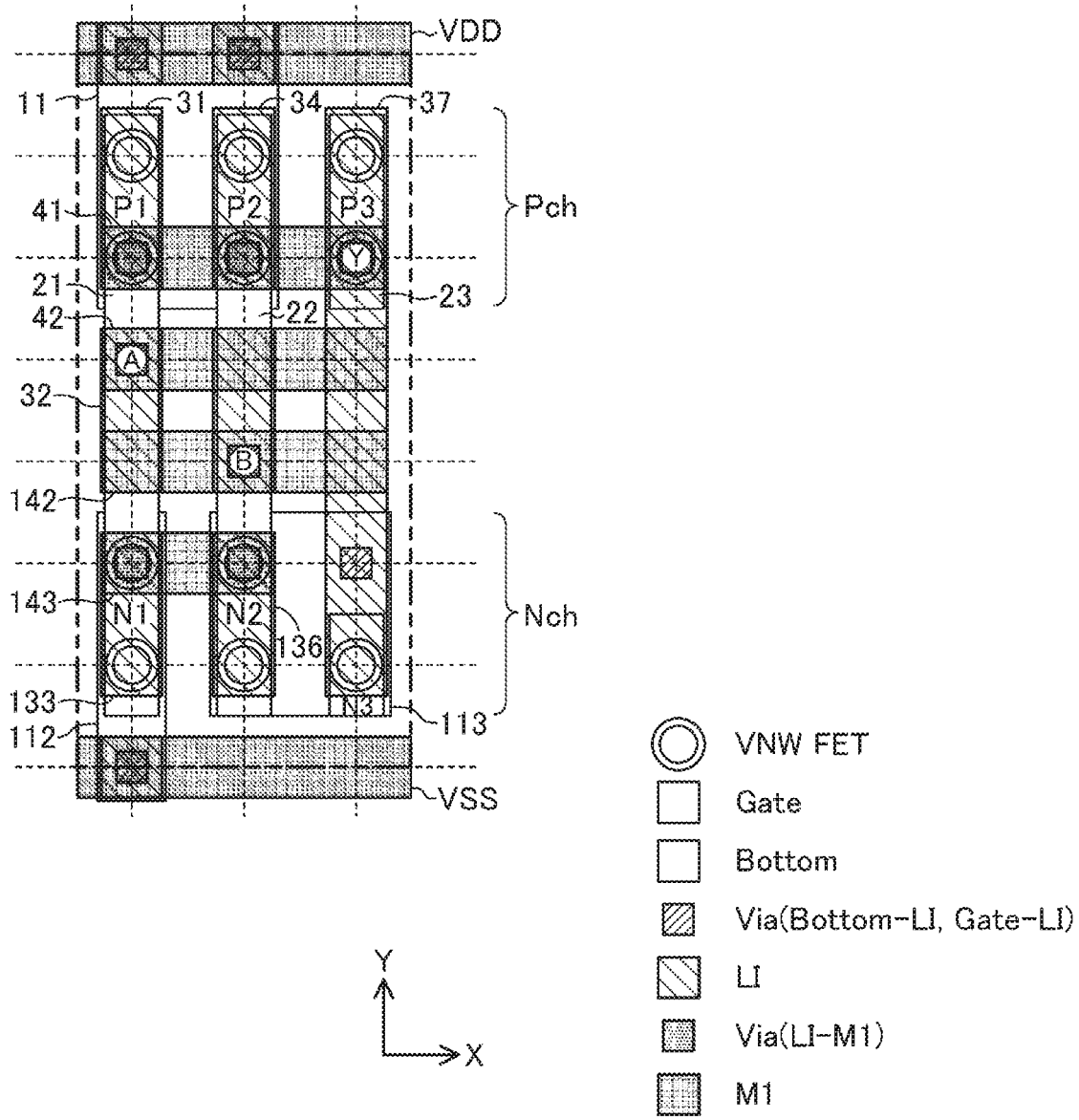
FIG. 13 is a plan view showing an example of the layout structure of a standard cell according to another embodiment.

FIG. 13 is a plan view showing an example of the layout structure of a cell according to another embodiment. The cell of FIG. 13 is similar to the cell according to the first embodiment shown in FIG. 1 for the configuration of the p-type transistor region, and is similar to the cell according to the second embodiment shown in FIG. 9 for the configuration of the n-type transistor region.

Similar functions and effects to those in the first and second embodiments can also be obtained with the layout structure in this embodiment. That is, in the p-type transistor region, the transistor P3 that is a dummy VNW FET is placed. This prevents or reduces variations in the distribution of p-type VNW FETs, increasing the fabrication precision and also preventing or reducing variations in transistor characteristics. Likewise, in the n-type transistor region, the transistor N3 that is a dummy VNW FET is placed. This prevents or reduces variations in the distribution of n-type VNW FETs, increasing the fabrication precision and also preventing or reducing variations in transistor characteristics.

Other functions and effects in the first and second embodiments can also be obtained. The alterations described in the first and second embodiments are also applicable to this embodiment.

(No. 2)

Figure 14:
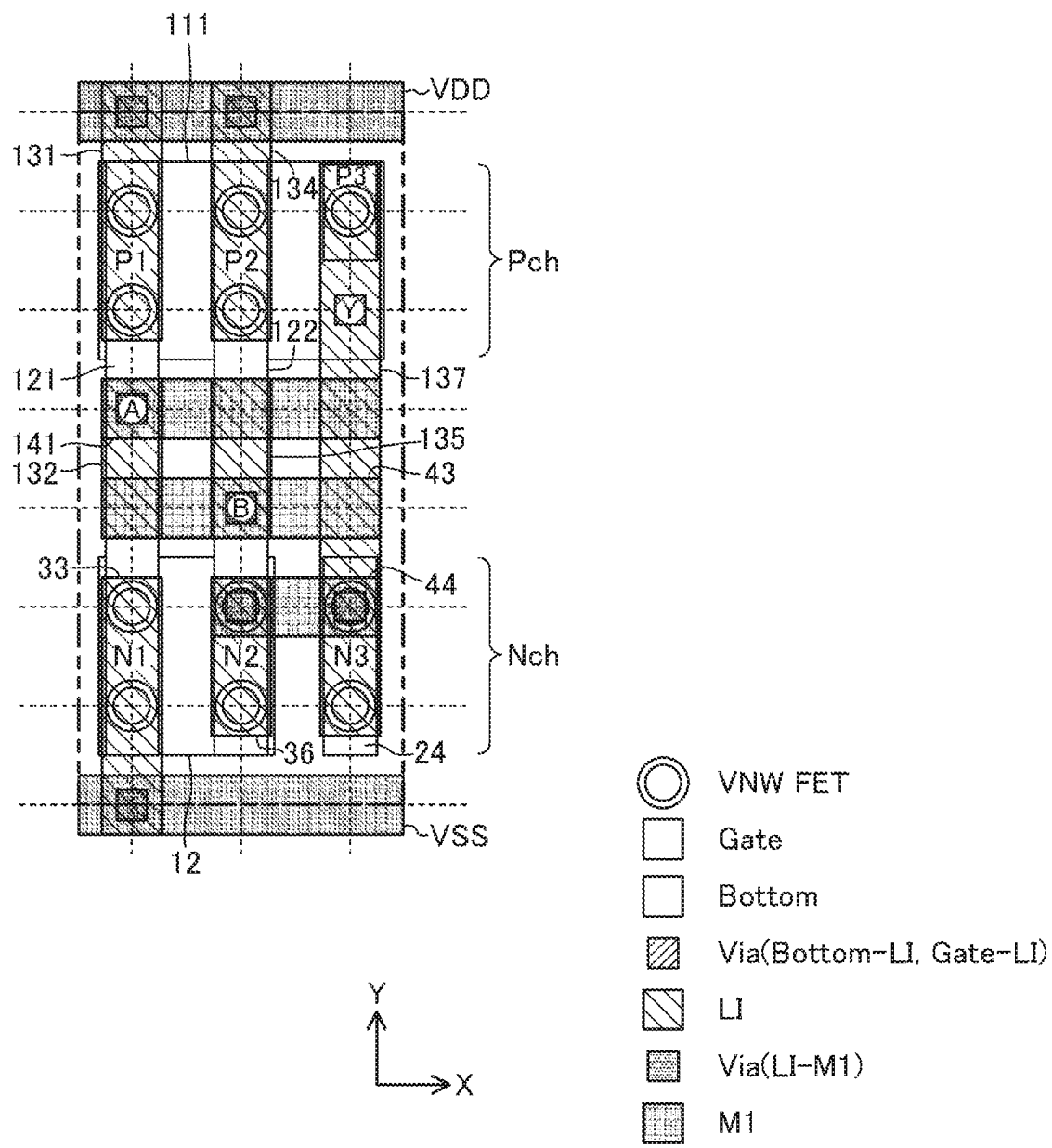
FIG. 14 is a plan view showing an example of the layout structure of a standard cell according to yet another embodiment.

FIG. 14 is a plan view showing an example of the layout structure of a cell according to yet another embodiment. The cell of FIG. 14 is similar to the cell according to the second embodiment shown in FIG. 9 for the configuration of the p-type transistor region, and is similar to the cell according to the first embodiment shown in FIG. 1 for the configuration of the n-type transistor region.

Similar functions and effects to those in the first and second embodiments can also be obtained with the layout structure in this embodiment. That is, in the p-type transistor region, the transistor P3 that is a dummy VNW FET is placed. This prevents or reduces variations in the distribution of p-type VNW FETs, increasing the fabrication precision and also preventing or reducing variations in transistor characteristics. Likewise, in the n-type transistor region, the transistor N3 that is a dummy VNW FET is placed. This prevents or reduces variations in the distribution of n-type VNW FETs, increasing the fabrication precision and also preventing or reducing variations in transistor characteristics.

Other functions and effects in the first and second embodiments can also be obtained. The alterations described in the first and second embodiments are also applicable to this embodiment.

(No. 3)

Figure 15:
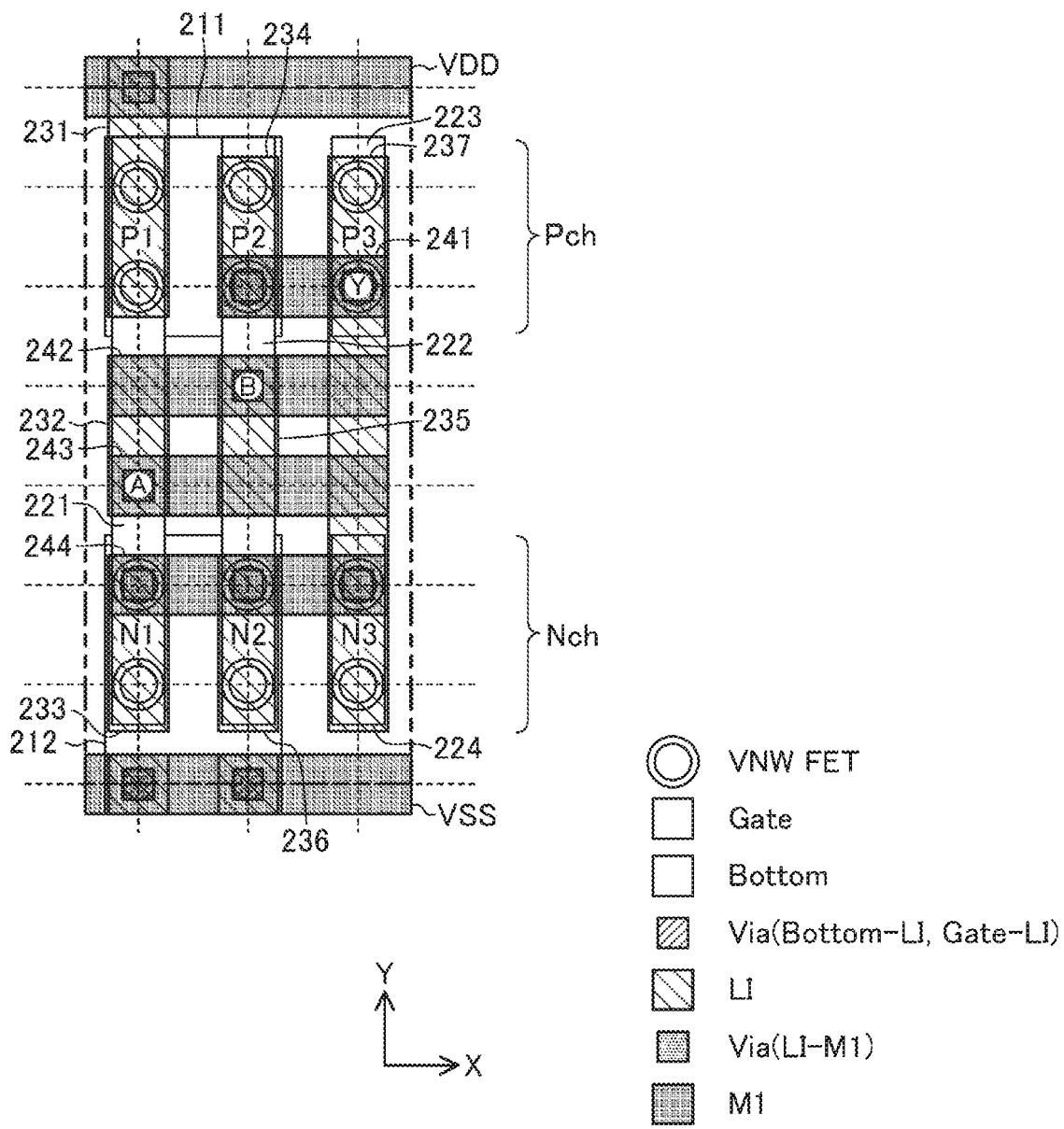
FIG. 15 is a plan view showing an example of the layout structure of a standard cell according to yet another embodiment.
Figure 16:
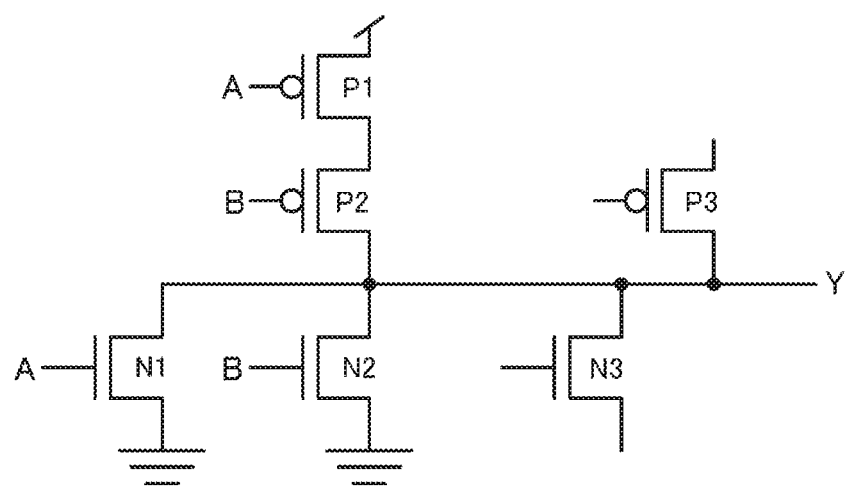
FIG. 16 is a circuit diagram of the standard cell shown in FIG. 15.

FIG. 15 is a plan view showing an example of the layout structure of a cell according to yet another embodiment, and FIG. 16 is a circuit diagram of the cell shown in FIG. 15. As shown in FIG. 16, the cell shown in FIG. 15 implements a two-input NOR circuit having inputs A and B and an output Y.

As is found from comparing FIG. 16 with FIG. 4, the layout structure of FIG. 15 corresponds to a structure obtained by vertically inverting the p-type transistor region and the n-type transistor region of the layout structure of FIG. 1. The transistors P1, P2, N1, and N2 are active VNW FETs and the transistors P3 and N3 are dummy VNW FETs. Note that, in the following description, description may be omitted for a configuration in common with the first embodiment.

Interconnects 241, 242, 243, and 244 extending in the X direction are formed in parallel in an M1 interconnect layer. The interconnect 241 corresponds to the output Y, the interconnect 242 corresponds to the input B, and the interconnect 243 corresponds to the input A.

The bottoms of the transistors P1 and P2 are connected to a bottom region 211. The top of the transistor P1 is connected to a local interconnect 231, and the top of the transistor P2 is connected to a local interconnect 234. The local interconnects 231 and 234 extend in parallel in the Y direction. The local interconnect 231 extends to a region overlapping the power supply interconnect VDD as viewed from top, and is connected with the power supply interconnect VDD through a via. The local interconnect 234 is connected with the interconnect 241 that is to be the output Y through a via.

The gate of the transistor P1 is connected with a gate interconnect 221, and the gate of the transistor P2 is connected with a gate interconnect 222. The gate interconnects 721 and 222 extend in parallel in the Y direction across the p-type transistor region and the n-type transistor region. The gate interconnect 221 is connected with the interconnect 243 that is to be the input A through a via, a local interconnect 232 and a via. The gate interconnect 222 is connected with the interconnect 242 that is to be the input B through a via, a local interconnect 235, and a via.

The transistor P3 is floating at its bottom that is not connected to the bottom region 211 and is connected to a local interconnect 237 at its top. The local interconnect 237 is an example of the signal interconnect according to the present disclosure. The local interconnect 237 extends in the Y direction across the p-type transistor region and the n-type transistor region. The local interconnect 237 is connected with the interconnect 241 that is to be the output Y. The gates of the two VNWs constituting the transistor P3 are mutually connected through a gate interconnect 223. The transistor P3 is a dummy VNW FET.

The bottoms of the transistors N1 and N2 are connected to a bottom region 212. The bottom region 212 spreads over to a range overlapping the power supply interconnect VSS as viewed from top. The bottom region 212 is connected with the power supply interconnect VSS through a local interconnect and a via, to receive the power supply voltage VSS. The top of the transistor N1 is connected to a local interconnect 233, and the top of the transistor N2 is connected to a local interconnect 236. The local interconnects 233 and 236 extend in parallel in the Y direction, and are connected with an interconnect 244 through vias.

The gate of the transistor N1 is connected with the gate interconnect 221 that is connected with the gate of the transistor P1, and the gate of the transistor N2 is connected with the gate interconnect 222 that is connected with the gate of the transistor P2. As described above, the gate interconnect 221 is connected with the interconnect 243 that is to be the input A through a via, the local interconnect 232, and a via. The gate interconnect 222 is connected with the interconnect 242 that is to be the input B through a via, the local interconnect 235, and a via.

The transistor N3 is floating at its bottom that is not connected to the bottom region 212 and connected to the local interconnect 237 at its top. As described above, the local interconnect 237 is connected with the interconnect 241 that is to be the output Y through a via. The gates of the two VNWs constituting the transistor N3 are mutually connected through a gate interconnect 224. The transistor N3 is a dummy VNW FET.

Similar functions and effects to those of the first embodiment can also be obtained with the layout structure in this embodiment. That is, in the p-type transistor region, the transistor P3 that is a dummy VNW FET is placed. This makes the distribution of p-type VNW FETs uniform, increasing the fabrication precision and also preventing or reducing variations in transistor characteristics. Likewise, in the n-type transistor region, the transistor N3 that is a dummy VNW FET is placed. This makes the distribution of n-type VNW FETs uniform, increasing the fabrication precision and also preventing or reducing variations in transistor characteristics.

Other functions and effects in the first embodiment can also be obtained. The alterations described in the first embodiment are also applicable to this embodiment.

(No. 4)

Figure 17:
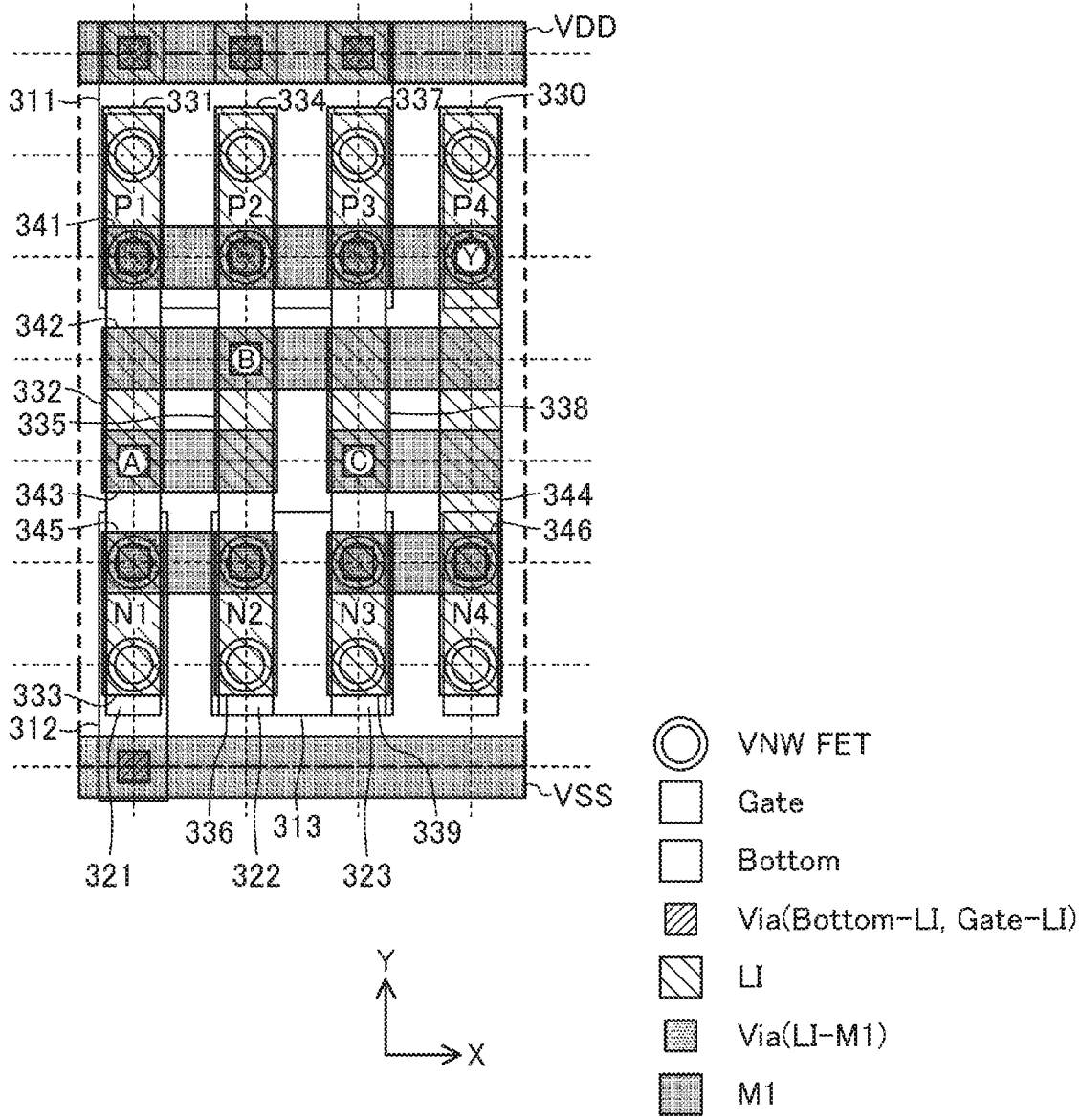
FIG. 17 is a plan view showing an example of the layout structure of a standard cell according to yet another embodiment.
Figure 18A:
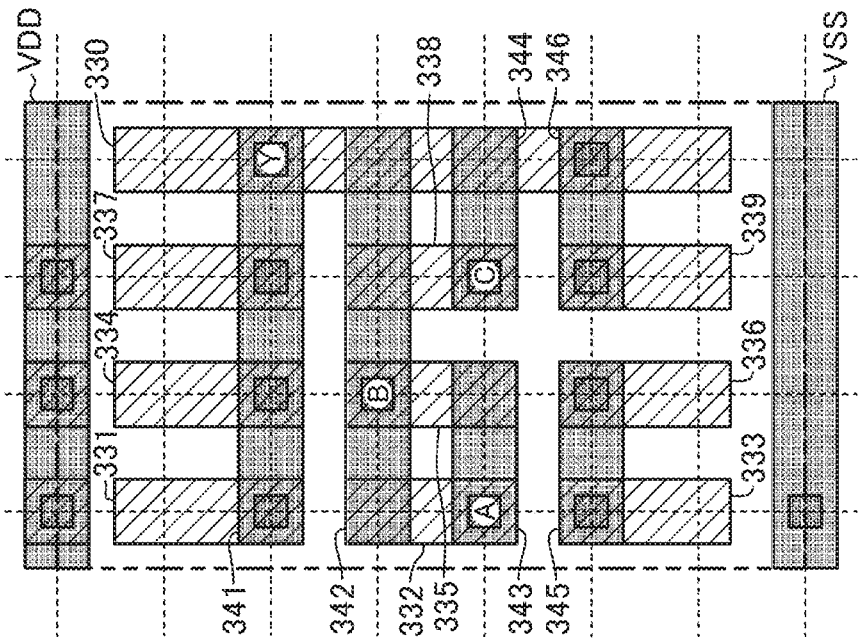
FIGS. 18A and 18B are plan views in different layers showing the layout structure of the standard cell shown in FIG. 17.
Figure 18B:
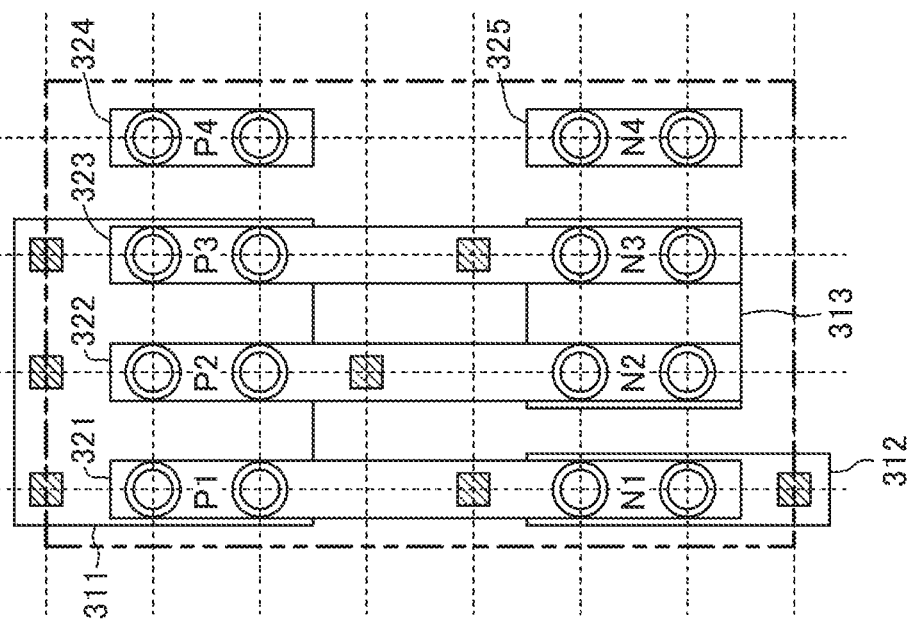
Figure 19:
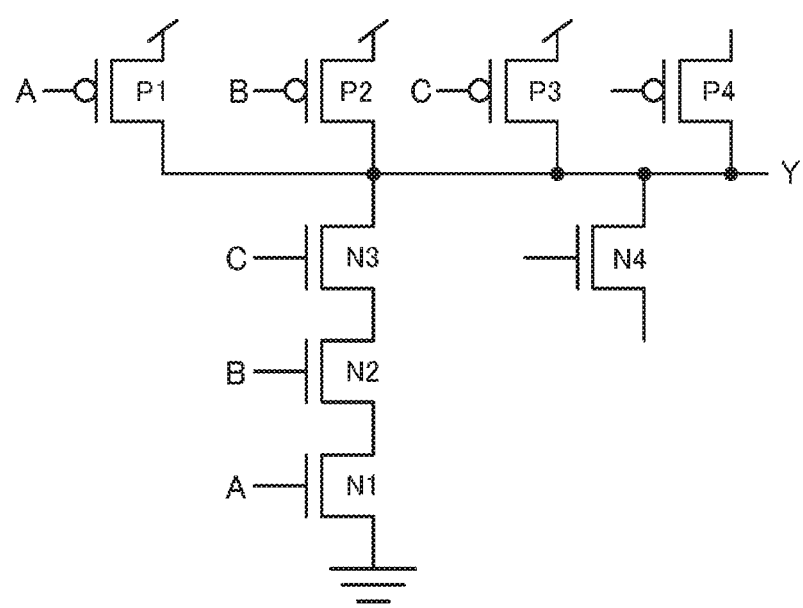
FIG. 19 is a circuit diagram of the standard cell shown in FIGS. 17, 18A, and 18B.

FIG. 17 is a plan view showing an example of the layout structure of a cell according to yet another embodiment, and FIGS. 18A and 18B are plan views in different layers. Specifically, FIG. 18A shows VNW FETs and layers below them, and FIG. 18B shows layers above the VNW FETs. FIG. 19 is a circuit diagram of the cell shown in FIGS. 17, 18A, and 18B. As shown in FIG. 19, the cell shown in FIGS. 17, 18A, and 18B implements a three-input NAND circuit having inputs A, B, and C and an output Y. Note that, in the following description, description may be omitted for a configuration in common with the first embodiment.

As shown in FIGS. 17, 18A, and 18B, in the layout structure in this embodiment, transistors P1, P2, P3, and P4 are arranged in the X direction in the p-type transistor region. Each of the transistors P1, P2, P3, and P4 has two VNWs lying side by side in the Y direction. In the n-type transistor region, transistors N1, N2, N3, and N4 are arranged in the X direction. Each of the transistors N1, N2, N3, and N4 has two VNWs lying side by side in the Y direction. The transistors P1, P2, P3, N1, N2, and N3 are active VNW FETs, and the transistors P4 and N4 are dummy VNW FETs.

Interconnects 341, 342, 343, 344, 345, and 346 extending in the X direction are formed in parallel in the M1 interconnect layer. The interconnect 341 corresponds to the output Y, the interconnect 342 corresponds to the input B, the interconnect 343 corresponds to the input A, and the interconnect 344 corresponds to the input C.

The bottoms of the transistors P1, P2, and P3 are connected to a bottom region 311. The bottom region 311 spreads over to a range overlapping the power supply interconnect VDD as viewed from top. The bottom region 311 is connected with the power supply interconnect VDD through a local interconnect and a via, to receive the power supply voltage VDD. The top of the transistor P1 is connected to a local interconnect 331, the top of the transistor P2 is connected to a local interconnect 334, and the top of the transistor P3 is connected to a local interconnect 337. The local interconnects 331, 334, and 337 extend in parallel in the Y direction, and are connected with the interconnect 341 that is to be the output Y through a via.

The gate of the transistor P1 is connected with a gate interconnect 321, the gate of the transistor P2 is connected with a gate interconnect 322, and the gate of the transistor P3 is connected with a gate interconnect 323. The gate interconnects 321, 322, and 323 extend in parallel in the Y direction across the p-type transistor region and the n-type transistor region. The gate interconnect 321 is connected with a local interconnect 332 through a via. The gate interconnect 322 is connected with a local interconnect 335 through a via. The gate interconnect 323 is connected with a local interconnect 338 through a via. The local interconnect 332 is connected with the interconnect 343 that is to be the input A through a via. The local interconnect 335 is connected with the interconnect 342 that is to be the input B through a via. The local interconnect 338 is connected with the interconnect 344 that is to be the input C through a via.

The transistor P4 is floating at its bottom that is not connected to the bottom region 311, and is connected to a local interconnect 330 at its top. The local interconnect 330 is an example of the signal interconnect according to the present disclosure. The local interconnect 330 extends in the Y direction across the p-type transistor region and the n-type transistor region. The local interconnect 330 is connected with the interconnect 341 that is to be the output Y through a via. That is, the top of the transistor P4 is connected with the interconnect 341 that is to be the output Y through the local interconnect 330 and a via. The gates of the two VNWs constituting the transistor P4 are mutually connected through a gate interconnect 324. The transistor P4 is a dummy VNW FET.

The bottom of the transistor N1 is connected to a bottom region 312. The bottom region 312 extends to a region overlapping the power supply interconnect VSS as viewed from top. The bottom region 312 is connected with the power supply interconnect VSS through a via, a local interconnect, and a via, to receive the power supply voltage VSS. The bottoms of the transistors N2 and N3 are connected to a bottom region 313. The top of the transistor N1 is connected to a local interconnect 333, the top of the transistor N2 is connected to a local interconnect 336, and the top of the transistor N3 is connected to a local interconnect 339. The local interconnects 333 and 336 are connected to an interconnect 345 through vias. The local interconnect 339 is connected to an interconnect 346 through a via, and connected with the interconnect 341 that is to be the output Y through the interconnect 346 and the local interconnect 330.

The gate of the transistor N1 is connected with the gate interconnect 321 that connected with the gate of the transistor P1, the gate of the transistor N2 is connected with the gate interconnect 322 that is connected with the gate of the transistor P2, and the gate of the transistor N3 is connected with the gate interconnect 323 that is connected with the gate of the transistor P3. As described above, the gate interconnect 321 is connected with the interconnect 343 that is to be the input A through a via, the local interconnect 332, and a via. Also, the gate interconnect 322 is connected with the interconnect 342 that is to be the input B through a via, the local interconnect 335, and a via. The gate interconnect 323 is connected with the interconnect 344 that is to be the input C through a via, the local interconnect 338, and a via.

The transistor N4 is floating at its bottom that is not connected to the bottom region 313, and is connected to the local interconnect 330 at its top. That is, the top of the transistor N4 is connected with the interconnect 341 that is to be the output Y through the local interconnect 330 and a via. The gates of the two VNWs constituting the transistor N4 are mutually connected through a gate interconnect 325. The transistor N4 is a dummy VNW FET.

Having the layout structure as described above, functions and effects similar to those in the first embodiment are obtained.

That is, in the p-type transistor region, the transistor P4 that is a dummy VNW FET is placed. This prevents or reduces variations in the distribution of p-type VNW FETs, increasing the fabrication precision and also preventing or reducing variations in transistor characteristics. Likewise, in the n-type transistor region, the transistor N4 that is a dummy VNW FET is placed. This prevents or reduces variations in the distribution of n-type VNW FETs, increasing the fabrication precision and also preventing or reducing variations in transistor characteristics.

The gates of the two VNWs constituting the transistor P4 are mutually connected through the gate interconnect 324, and the gates of the two VNWs constituting the transistor N4 are mutually connected through the gate interconnect 325. This makes the gate pattern uniform, increasing the fabrication precision and also preventing or reducing variations in transistor characteristics.

The gate interconnects 321, 322, 323, 324, and 325 all extend in the Y direction and have the same interconnect width. This makes fabrication easy and increases the fabrication precision. The local interconnects 330, 331, 332, 333, 334, 335, 336, 337, 338, and 339 all extend in the Y direction and have the same interconnect width. This makes fabrication easy and increases the fabrication precision. The interconnects 341, 342, 343, 344, 345, and 346 in the M1 interconnect layer all extend in the X direction and have the same interconnect width. This makes fabrication easy and increases the fabrication precision.

The alterations described in the first embodiment are also applicable to this embodiment. Also, by vertically inverting the p-type transistor region and the n-type transistor region of the layout structure of FIG. 17, a three-input NOR circuit cell can be implemented.

The relationship between the number of inputs of a NAND circuit and the electrode (bottom or top) of an n-type VNW FET to which the power supply voltage VSS is supplied will be described hereinafter.

In the first embodiment, the power supply voltage VSS is supplied to the top of the transistor N1 out of the two serially-connected transistors N1 and N2. In this embodiment, the power supply voltage VSS is supplied to the bottom of the transistor N1 out of the three serially-connected transistors N1, N2, and N3. This is because it is preferable to connect the top of a transistor to the interconnect that is to be the output Y. To state in general, it is preferable that, when the number of serially-connected n-type transistors is even, the power supply voltage VSS should be supplied to the top of one of the n-type transistors to which VSS is to be supplied, and, when the number of serially-connected n-type transistors is odd, the power supply voltage VSS should be supplied to the bottom of one of the n-type transistors to which VSS is to be supplied.

The above also applies to the relationship between the number of inputs of a NOR circuit and the electrode (bottom or top) of a p-type VNW FET to which the power supply voltage VDD is supplied. That is, it is preferable that, when the number of serially-connected p-type transistors is even, the power supply voltage VDD should be supplied to the top of one of the p-type transistors to which VDD is to be supplied, and, when the number of serially-connected p-type transistors is odd, the power supply voltage VDD should be supplied to the bottom of one p-type transistors to which VDD is to be supplied.

(No. 5)

While the planar shape of VNWs is a circle in the layout structure examples described above, it is not limited to a circle. For example, the planar shape of the VNWs can be a rectangle or an oval.

Figure 20:
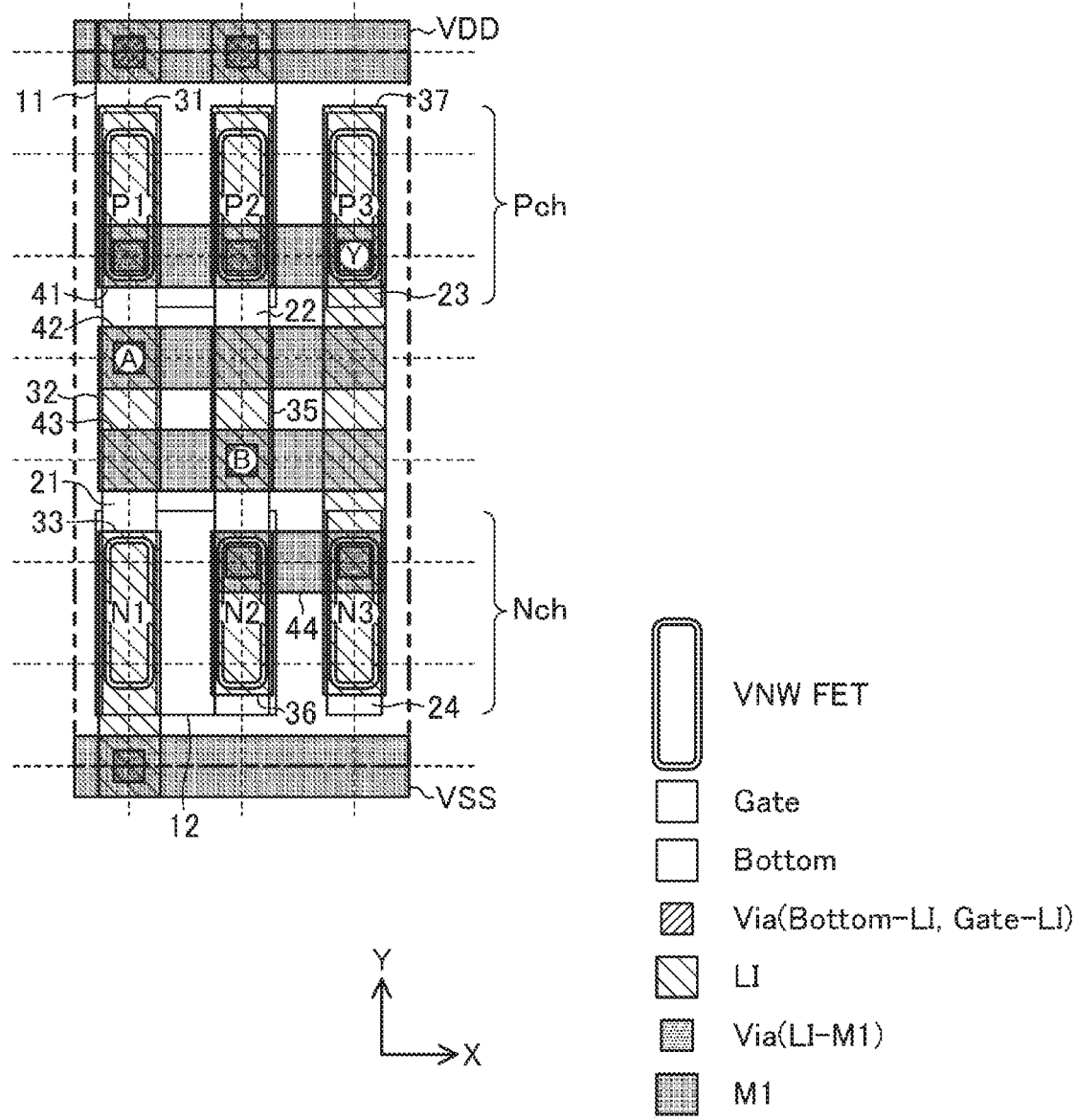
FIG. 20 is a plan view showing an example of the layout structure of a standard cell according to yet another embodiment.

FIG. 20 shows an example of the layout structure in which, in the cell of FIG. 1, the planar shape of VNWs is an oval extending in the Y direction. The configuration other than the shape of the VNWs is similar to that of FIG. 1, and thus detailed description thereof is omitted here. With this layout structure, also, functions and effects similar to those in the first embodiment are obtained. Also, since the area of the VNWs per unit area becomes larger, a larger amount of current is allowed to flow to the transistors, and thus speedup of the semiconductor integrated circuit device can be realized.

When the VNWs have a planar shape extending long in one direction like the oval shown in FIG. 20, the extension direction is preferably uniform. Also, the positions of the ends are preferably aligned.

For the other layout structures described above, also, the planar shape of the VNWs may be changed. Also, all VNWs in one standard cell do not necessarily have the same shape, but VNWs having different planar shapes may be mixed in one standard cell.

While the active VNW FETs are each constituted by two VNWs in the layout structure examples described above, the number of VNWs constituting the active VNW FET is not limited to this. Also, while the dummy VNW FETs are each constituted by one or two VNWs in the layout structure examples described above, the number of VNWs constituting the dummy VNW FET is not limited to this.

<Block Layout Example>

Figure 21:
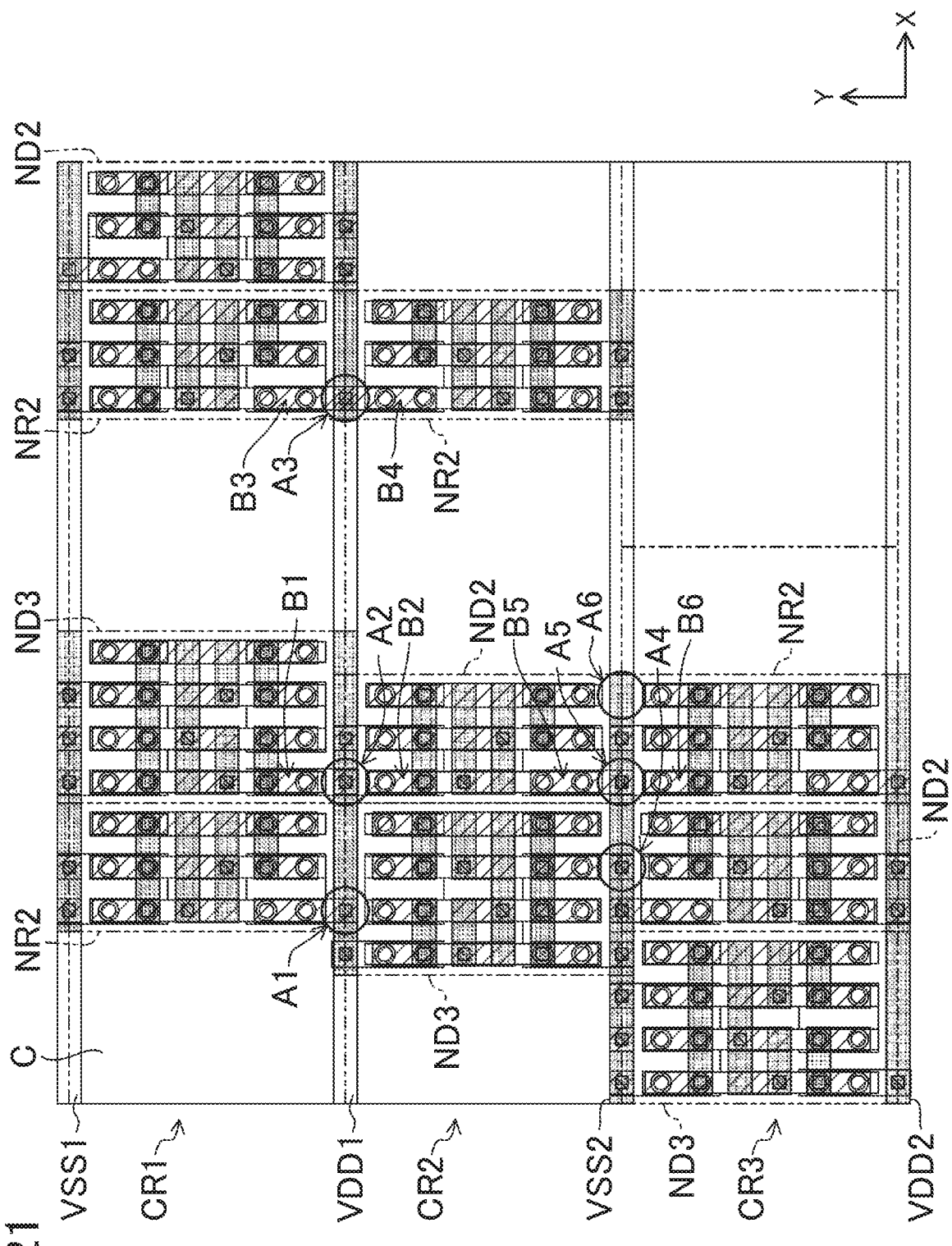
FIG. 21 is a plan view showing a layout example of a circuit block in which standard cells according to the present disclosure are arranged.

FIG. 21 is a plan view showing an example of the layout of a circuit block in a semiconductor integrated circuit device using the cells according to the present disclosure. In the circuit block shown in FIG. 21, a plurality of cell rows CR1, CR2, and CR3 each having a plurality of cells C lining up in the X direction (corresponding to the first direction) are arranged in the Y direction (corresponding to the second direction perpendicular to the first direction). Among the plurality of cells C, ND2 denotes a two-input NAND cell, NR2 a two-input NOR cell, and ND3 a three-input NAND cell, having the layout structures including VNW FETs as described above. For other cells, illustration of detailed layout structures is omitted. Power supply interconnects VSS1, VDD1, VSS2, and VDD2 extending in the X direction are placed on both sides of the plurality of cell rows CR1, CR2, and CR3 in the Y direction. The power supply interconnects VSS1 and VSS2 supply the power supply voltage VSS, and the power supply interconnects VDD1 and VDD2 supply the power supply voltage VDD.

In the circuit block shown in FIG. 21, the plurality of cell rows CR1, CR2, and CR3 are vertically flipped alternately, so that the adjacent cell rows share the power supply interconnect lying between them. For example, the cell rows CR1 and CR2 share the power supply interconnect VDD1, and the cell rows CR2 and CR3 share the power supply interconnect VSS2. The positions of the VNW FETs are aligned in the X direction.

In FIG. 21, at position A1, the power supply interconnect VDD1 is connected with the top electrode of a VNW FET of the two-input NOR cell NR2 located on its upper side. At position A2, the power supply interconnect VDD1 is connected with the bottom electrode of a VNW FET of the three-input NAND cell ND3 located on its upper side and the bottom electrode of a VNW FET of the two-input NAND cell ND2 located on its lower side. At position A3, the power supply interconnect VDD1 is connected with the top electrode of a VNW FET of the two-input NOR cell NR2 located on its upper side and the top electrode of a VNW FET of the two-input NOR cell NR2 located on its lower side. At position A4, the power supply interconnect VSS2 is connected with the bottom electrode of a VNW FET of the three-input NAND cell ND3 located on its upper side. At position A5, the power supply interconnect VSS2 is connected with the top electrode of a VNW FET of the two-input NAND cell ND2 located on its upper side and the bottom electrode of a VNW FET of the two-input NOR cell NR2 located on its lower side. At position A6, the power supply interconnect VSS2 is connected neither with a VNW FET of the two-input NAND cell ND2 located on its upper side nor a VNW FET of the two-input NOR cell NR2 located on its lower side.

In the layout of FIG. 21, interconnects can be formed from the power supply interconnects toward cell rows located on their upper and lower sides for connection with the top electrodes or bottom electrodes of VNW FETs of the cell rows without causing failure of the layout, whereby the power supply interconnects can be shared by the upper and lower cell rows. For example, at position A2, a VNW FET B1 included in the upper-side three-input NAND cell ND3 and a VNW FET B2 included in the lower-side two-input NAND cell ND2 are placed at the same position in the X direction. The power supply interconnect VDD1 is connected with the bottom electrode of the VNW FET B1 and the bottom electrode of the VNW FET B2. Also, at position A3, a VNW FET B3 included in the upper-side two-input NOR cell NR2 and a VNW FET B4 included in the lower-side two-input NOR cell NR2 are placed at the same position in the X direction. The power supply interconnect VDD1 is connected with the top electrode of the VNW FET B3 and the top electrode of the VNW FET B4. At position A5, a VNW FET B5 included in the upper-side two-input NAND cell ND2 and a VNW FET B6 included in the lower-side two-input NOR cell NR2 are placed at the same position in the X direction. The power supply interconnect VSS2 is connected with the top electrode of the VNW FET B5 and the bottom electrode of the VNW FET B6.

Accordingly, by using the layout as described above, reduction in the area of the semiconductor integrated circuit device can be achieved. Note that a configuration of connecting both the top electrodes and bottom electrodes of VNW FETs to the power supply interconnects is also possible.

According to the present disclosure, in a semiconductor integrated circuit device provided with standard cells using VNW FETs, it is possible to prevent educe fabrication variations and achieve area reduction. The present disclosure is therefore useful for improvement of the performance of a semiconductor chip, for example.

What is claimed is:

1. A semiconductor integrated circuit device including a standard cell, wherein
   the standard cell includes
   a first power supply interconnect extending in a first direction, configured to supply a first power supply voltage,
   a second power supply interconnect extending in the first direction, configured to supply a second power supply voltage different from the first power supply voltage,
   a p-type transistor region provided between the first power supply interconnect and the second power supply interconnect on a side closer to the first power supply interconnect, in which one or more active p-type vertical nanowire (VNW) FETs are formed,
   an n-type transistor region provided between the first power supply interconnect and the second power supply interconnect on a side closer to the second power supply interconnect, in which one or more active n-type VNW FETs are formed, and
   a signal interconnect placed across the p-type transistor region and the n-type transistor region,
   at least one dummy VNW FET is formed in at least either the p-type transistor region or the n-type transistor region, and
   a top electrode of the dummy VNW FET is connected with the signal interconnect.

2. The semiconductor integrated circuit device of claim 1, wherein
   a bottom electrode of the dummy VNW FET is connected with the signal interconnect.

3. The semiconductor integrated circuit device of claim 1, wherein
   a gate electrode of the dummy VNW FET is connected with the signal interconnect.

4. The semiconductor integrated circuit device of claim 1, wherein
   the dummy VNW FET includes a first dummy VNW FET formed in the p-type transistor region and a second dummy VNW FET formed in the n-type transistor region.

5. The semiconductor integrated circuit device of claim 4, wherein
   gate electrodes of the first and second dummy VNW FETs are mutually connected through a common gate interconnect and also connected with the signal interconnect.

* * * * *